(12) United States Patent
Mikawa et al.

(10) Patent No.: US 11,128,046 B2
(45) Date of Patent: Sep. 21, 2021

(54) ANTENNA DEVICE AND ELECTRONIC EQUIPMENT

(71) Applicant: Murata Manufacturing Co., Ltd., Nagaokakyo (JP)

(72) Inventors: Kentaro Mikawa, Nagaokakyo (JP); Kenichi Ishizuka, Nagaokakyo (JP); Takafumi Nasu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 209 days.

(21) Appl. No.: 16/354,222

(22) Filed: Mar. 15, 2019

(65) Prior Publication Data

US 2019/0214727 A1   Jul. 11, 2019

Related U.S. Application Data

(63) Continuation of application No. PCT/JP2017/042706, filed on Nov. 29, 2017.

(30) Foreign Application Priority Data

Nov. 29, 2016   (JP) .............................. JP2016-231024
Dec. 28, 2016   (JP) .............................. JP2016-255729
(Continued)

(51) Int. Cl.
*H01Q 1/24*        (2006.01)
*H01Q 5/335*       (2015.01)
(Continued)

(52) U.S. Cl.
CPC .............. *H01Q 5/335* (2015.01); *H01Q 1/24* (2013.01); *H01Q 1/48* (2013.01); *H01Q 9/0457* (2013.01); *H03H 7/38* (2013.01)

(58) Field of Classification Search
CPC ........ H01Q 5/335; H01Q 1/24; H01Q 9/0457; H01Q 1/48; H03H 7/38
See application file for complete search history.

(56) References Cited

U.S. PATENT DOCUMENTS

2002/0044092 A1*  4/2002  Kushihi ................. H01Q 5/335
                                                        343/702
2006/0262028 A1*  11/2006 Takei ................... H01Q 9/0442
                                                        343/850
(Continued)

FOREIGN PATENT DOCUMENTS

JP          42-7857 Y1     4/1967
JP          54-183246 U    12/1979
(Continued)

OTHER PUBLICATIONS

Official Communication issued in International Patent Application No. PCT/JP2017/042706, dated Feb. 20, 2018.

*Primary Examiner* — Dieu Hien T Duong
(74) *Attorney, Agent, or Firm* — Keating & Bennett, LLP

(57) ABSTRACT

An antenna device includes a radiating element, a coupling circuit, and a non-radiating resonant circuit. The coupling circuit includes first and second coupling elements, the first coupling element being connected between a feeder circuit and the radiating element, the second coupling element being coupled to the first coupling element. An end of the second coupling element is grounded, and another end of the second coupling element is connected to the non-radiating resonant circuit. A frequency characteristic of a return loss of the radiating element when seen from the feeder circuit is adjusted by a resonant frequency characteristic of the non-radiating resonant circuit.

20 Claims, 31 Drawing Sheets

(30) Foreign Application Priority Data

| | | |
|---|---|---|
| Apr. 18, 2017 | (JP) | JP2017-082043 |
| May 26, 2017 | (JP) | JP2017-104650 |
| Aug. 18, 2017 | (JP) | JP2017-158218 |

(51) Int. Cl.
  *H03H 7/38* (2006.01)
  *H01Q 9/04* (2006.01)
  *H01Q 1/48* (2006.01)

(56) References Cited

U.S. PATENT DOCUMENTS

| | | | |
|---|---|---|---|
| 2011/0128200 A1* | 6/2011 | Hossain | H01Q 9/14 343/745 |
| 2014/0049440 A1 | 2/2014 | Ueki et al. | |
| 2015/0084817 A1* | 3/2015 | Yong | H01Q 5/335 343/702 |
| 2015/0371762 A1 | 12/2015 | Ishizuka | |
| 2017/0084998 A1 | 3/2017 | Ishizuka | |
| 2017/0133999 A1 | 5/2017 | Ishizuka et al. | |
| 2017/0302246 A1 | 10/2017 | Ishizuka | |
| 2017/0338545 A1* | 11/2017 | Guo | H01Q 1/243 |
| 2018/0013202 A1 | 1/2018 | Ito et al. | |

FOREIGN PATENT DOCUMENTS

| | | |
|---|---|---|
| WO | 2012/153690 A1 | 11/2012 |
| WO | 2014/155873 A1 | 10/2014 |
| WO | 2015/178204 A1 | 11/2015 |
| WO | 2016/114182 A1 | 7/2016 |
| WO | 2016/143724 A1 | 9/2016 |
| WO | 2016/152603 A1 | 9/2016 |
| WO | 2016/186091 A1 | 11/2016 |

* cited by examiner

115

116

Freq.(1.7GHz to 2.7GHz)

Freq.(1.7GHz to 2.7GHz)

Freq.(1.7GHz to 2.7GHz)

ANTENNA DEVICE AND ELECTRONIC EQUIPMENT

CROSS REFERENCE TO RELATED APPLICATIONS

This application claims the benefit of priority to Japanese Patent Application No. 2016-231024 filed on Nov. 29, 2016, Japanese Patent Application No. 2016-255729 filed on Dec. 28, 2016, Japanese Patent Application No. 2017-082043 filed on Apr. 18, 2017, Japanese Patent Application No. 2017-104650 filed on May 26, 2017, and Japanese Patent Application No. 2017-158218 filed on Aug. 18, 2017, and is a Continuation Application of PCT Application No. PCT/JP2017/042706 filed on Nov. 29, 2017. The entire contents of each of these applications are hereby incorporated herein by reference.

BACKGROUND OF THE INVENTION

1. Field of the Invention

The present invention relates to an antenna device that complies with a wide frequency band and electronic equipment including the antenna device.

2. Description of the Related Art

In order to broaden a frequency band or to comply with a plurality of frequency bands, an antenna device including two radiating elements that are directly or indirectly coupled to each other is used. In addition, International Publication No. 2012/53690 illustrates an antenna device including two radiating elements and a coupling degree adjustment circuit that controls power feeding to the two radiating elements.

In the antenna device illustrated in International Publication No. 2012/153690, the first radiating element and the second radiating element are coupled to each other via the transformer, and a feeder circuit and the antenna device are matched by a setting of the coupling. Since the first radiating element and the second radiating element do not have to be arranged in parallel to each other in the antenna device illustrated in International Publication No. 2012/153690, design of the patterns for the first radiating element and the second radiating element has a high degree of freedom. In addition, even if the first radiating element and the second radiating element are disposed closer to each other, a predetermined coupling degree is able to be set. This makes it easy to match the feeder circuit and a multi-resonance antenna.

However, in a frequency band in which one of the radiating elements largely contributes to radiation, when radiation from the other of the radiating elements influences radiation of the one of the radiating elements, a desired radiation characteristic might not be obtained, which degrades a radiation characteristic of an antenna.

SUMMARY OF THE INVENTION

Preferred embodiments of the present invention provide antenna devices that each avoid an issue of interference regarding radiation of two radiating elements so as to broaden the band and electronic equipment including the antenna devices.

An antenna device according to a preferred embodiment of the present invention includes a radiating element; a coupling circuit including a first coupling element and a second coupling element, the first coupling element being connected between the radiating element and a feeder circuit, the second coupling element being coupled to the first coupling element; and a non-radiating resonant circuit connected to the second coupling element, in which a frequency characteristic of a return loss of the radiating element is adjusted by a resonant frequency characteristic of the non-radiating resonant circuit.

With the above-described configuration, the radiating element and the non-radiating resonant circuit do not interfere with each other regarding radiation, in view of the radiating element being connected to the first coupling element of the coupling circuit and the non-radiating resonant circuit being connected to the second coupling element of the coupling circuit, and a radiation characteristic of the radiating element is not adversely affected. In addition, the frequency characteristic of a return loss of the radiating element seen from the feeder circuit is adjusted by a resonance characteristic of the non-radiating resonant circuit, and a pole is generated in a desired frequency band to broaden the band of the frequency characteristic of the antenna.

It is preferable that a direction of a magnetic field generated when current flows in the first coupling element in a direction from a terminal connected to the feeder circuit to a terminal connected to the radiating element is opposite to a direction of a magnetic field generated when current flows in the second coupling element in a direction from a terminal connected to the non-radiating resonant circuit to a terminal connected to a ground. Thus, a mutual inductance due to the coupling between the first coupling element and the second coupling element decreases inductances of the first coupling element and the second coupling element, so as to have little influence on a circuit characteristic and the radiation characteristic of the radiating element.

It is preferable that the first coupling element and the second coupling element are multi-layered coil conductor patterns, and that the coupling circuit defines a transformer in which the first coupling element and the second coupling element are electromagnetically coupled to each other. Thus, a coupling circuit with a high coupling coefficient between the first coupling element and the second coupling element is provided, and the resonance characteristic of the non-radiating resonant circuit when seeing from the feeder circuit is likely to be shown.

It is preferable that about half or more of the non-radiating resonant circuit is included within a formation region of the radiating element in a plan view of the radiating element. Thus, the non-radiating resonant circuit is shielded by the radiating element. This increases a non-radiating property of the non-radiating resonant circuit seen from a distance.

It is preferable that the radiating element is defined by a conductive member that includes three sides in a plan view, and that the non-radiating resonant circuit is surrounded by the three sides in a plan view. Thus, the non-radiating resonant circuit is shielded by the radiating element. This increases the non-radiating property of the non-radiating resonant circuit seen from a distance.

It is preferable that the non-radiating resonant circuit is defined by a linear conductor pattern that includes a returning portion along the linear conductor pattern. Thus, sharpness of the resonance of the non-radiating resonant circuit is degraded, and the non-radiating resonant circuit is able to attenuate a reflection coefficient in a relatively wide band including the band in which the pole generated in the frequency characteristic of the antenna and its periphery. In addition, the non-radiating resonant circuit is able to be provided in a small area.

It is preferable that the conductor pattern includes a first linear conductor pattern portion that extends from the coupling circuit and a second conductor pattern portion that returns, at the returning portion, to be away from the radiating element. This reduces or prevents unnecessary coupling between the non-radiating resonant circuit and the radiating element.

It is preferable to further include a phase shifter that is connected between the feeder circuit and the first coupling element and that has a frequency dependency. This makes it possible to provide an antenna device that performs impedance matching in a wide band.

It is preferable that a second terminal of the second coupling element is connected to the ground, the second terminal being opposite to a first terminal to which the non-radiating resonant circuit is connected, and that a length of a line between the first coupling element and the feeder circuit and a length of a line between the second terminal of the second coupling element and the ground are each less than about ⅛ wavelength of a resonant frequency.

Since the coupling circuit mainly uses magnetic field coupling, the strength of coupling is increased when the coupling circuit is included at a portion at which a strong current flows. The strong coupling is able to improve the influence of resonance obtained by adding the coupling circuit and the parasitic element, and since a resonant bandwidth is broadened, a frequency band in which communication is possible is broadened. In addition, a signal intensity is increased, and a communication characteristic is improved.

The antenna device may include an inductor that is connected between the second coupling element and the non-radiating resonant circuit. Thus, since the inductor is included at a portion at which current is low, while a change in the coupling is reduced or prevented (change in impedance matching is reduced or prevented), the resonant frequency on the non-radiating resonant circuit side is able to be decreased, and a desired communication band is able to be obtained. Alternatively, while the resonant frequency is maintained, the length of the non-radiating resonant circuit is able to be reduced, and thus the area used is able to be reduced.

The antenna device may include an inductor that is connected between the first terminal of the second coupling element and the ground. Thus, reactance generated by a parasitic capacitance between the ground and the coupling circuit by insertion of the coupling circuit is able to be suppressed, and a change from a matching state in which the coupling circuit is not mounted is able to be reduced or prevented. In addition, the resonant frequency of the non-radiating resonant circuit is able to be decreased, and a desired communication band or communication characteristic is able to be obtained. Alternatively, while the resonant frequency is maintained, the length of the antenna is able to be reduced, and thus the area used is able to be reduced.

The antenna device may further include a capacitor that is connected between the second coupling element and the non-radiating resonant circuit. Thus, the resonant frequency on the non-radiating resonant circuit side is able to be increased, and a desired communication band is able to be obtained.

The antenna device may further include a capacitor that is connected between the first terminal of the second coupling element and the ground. Thus, a parasitic capacitance generated between the ground and the coupling circuit by insertion of the coupling circuit is able to be reduced, and a change from a matching state in which the coupling circuit is not mounted is able to be reduced or prevented. In addition, the resonant frequency on the non-radiating resonant circuit side is able to be increased, and a desired communication band or communication characteristic is able to be obtained.

The antenna device may further include a second coupling circuit including a third coupling element and a fourth coupling element, the third coupling element being connected between the first coupling element and the feeder circuit, the fourth coupling element being coupled to the third coupling element; and a second non-radiating resonant circuit connected to the fourth coupling element. Thus, the number of resonances to be added is able to be increased, and a bandwidth is broadened, and accordingly, a domain in which communication is possible is broadened. If the resonant frequency is the same or substantially the same, the impedance matching is improved.

The antenna device may further include a second coupling circuit including a third coupling element and a fourth coupling element, the third coupling element being connected between the second coupling element and the non-radiating resonant circuit, the fourth coupling element being coupled to the third coupling element; and a second non-radiating resonant circuit connected to the fourth coupling element. With this structure, a plurality of non-radiating resonant circuits are able to be used, and a communication characteristic is improved.

The antenna device may further include a switch connected between the non-radiating resonant circuit and the ground. This is able to change a resonant frequency added by providing the coupling circuit and the non-radiating resonant circuit and is able to change matching so as to improve impedance matching. In addition, the resonant frequency is able to be changed or matching is able to be changed such that the coupling circuit and the non-radiating resonant circuit are easily coupled to each other, thus improving impedance matching.

In a case in which the coupling circuit includes a parasitic capacitance, the antenna device preferably further includes an inductor that is connected to the coupling circuit and that reduced or prevented a reactance component generated in the coupling circuit by parallel resonance with the parasitic capacitance. Thus, a reactance component that is added by insertion of the coupling circuit is canceled, and a change from a matching state in which the coupling circuit is not mounted is able to be reduced or prevented.

An antenna device according to a preferred embodiment of the present invention includes a radiating element to which a feeder circuit is connected; a coupling circuit including a first coupling element and a second coupling element, the first coupling element being connected between the radiating element and a ground, the second coupling element being coupled to the first coupling element; and a non-radiating resonant circuit connected to the second coupling element, in which a frequency characteristic of a return loss of the radiating element is adjusted by a resonant frequency characteristic of the non-radiating resonant circuit.

With the above-described configuration, the radiating element and the non-radiating resonant circuit do not interfere with each other regarding radiation, in which the radiating element is connected to the first coupling element of the coupling circuit and the non-radiating resonant circuit is connected to the second coupling element of the coupling circuit, and the radiation characteristic of the radiating element is not adversely affected. In addition, the frequency characteristic of a return loss of the radiating element seen from the feeder circuit is adjusted by the resonance characteristic of the non-radiating resonant circuit, and a pole is generated in a desired frequency band to broaden the band of the frequency characteristic of the antenna. Since a current intensity is particularly high in a portion that is connected to the ground, the radiating element and the non-radiating resonant circuit are able to be coupled to each other via the coupling circuit. In addition, the coupling circuit and the non-radiating resonant circuit are able to be disposed with a higher degree of freedom.

Electronic equipment according to a preferred embodiment of the present invention includes an antenna device according to a preferred embodiment; the feeder circuit connected to the coupling circuit; and a housing in which the feeder circuit is accommodated, in which a portion of the radiating element or the entire radiating element is a portion of the housing.

With the above configuration, it is not necessary to provide a conductive member or a conductor pattern that is dedicated to the radiating element, and downsizing is able to be achieved. Also in electronic equipment including a metal housing, the metal housing does not block electromagnetic waves.

According to preferred embodiments of the present invention, antenna devices that avoid the issue of interference regarding radiation of two radiating elements so as to broaden the band and the electronic equipment including the antenna devices are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
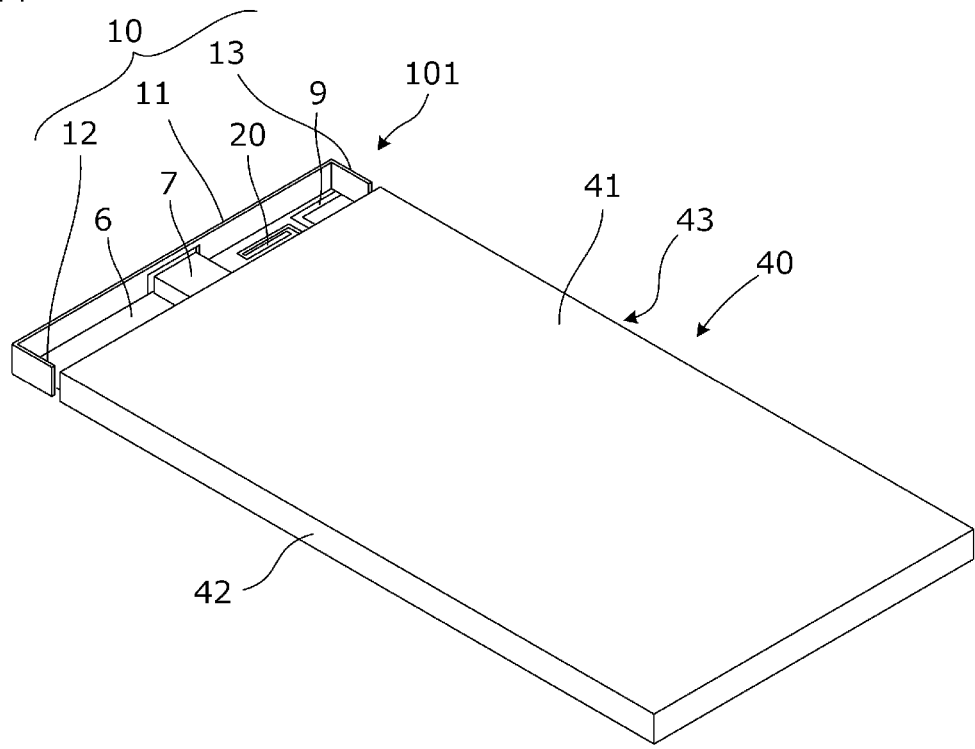
FIG. 1 is a perspective view illustrating a main configuration of an antenna device 101 according to a first preferred embodiment of the present invention and electronic equipment including the antenna device 101.

A plurality of preferred embodiments of the present invention will be described below with reference to specific examples and the drawings. The same reference numerals denote the same or substantially the same portions and elements in the drawings. Considering the explanation of main points and to facilitate understanding, the preferred embodiments are separately illustrated for convenience. However, portions and elements illustrated in different preferred embodiments may be replaced or combined. In second and subsequent preferred embodiments, a description of portions and elements that are common to a first preferred embodiment will be omitted, and only different points will be described. In particular, the same or substantially the same advantageous effects obtained by the same or substantially the same configuration will not be repeated in the preferred embodiments.

The "antenna device" illustrated in the preferred embodiments is applicable to one that transmits signals or one that receives signals. Even in a case in which the "antenna device" is described as an antenna that radiates electromagnetic waves, the antenna device is not limited to a source that generates the electromagnetic waves. Also in a case of receiving an electromagnetic wave that is generated by a communication-partner antenna device, that is, even when the transmission and reception are reversed, the same or substantially the same advantageous effects are produced.

First Preferred Embodiment

Figure 2:
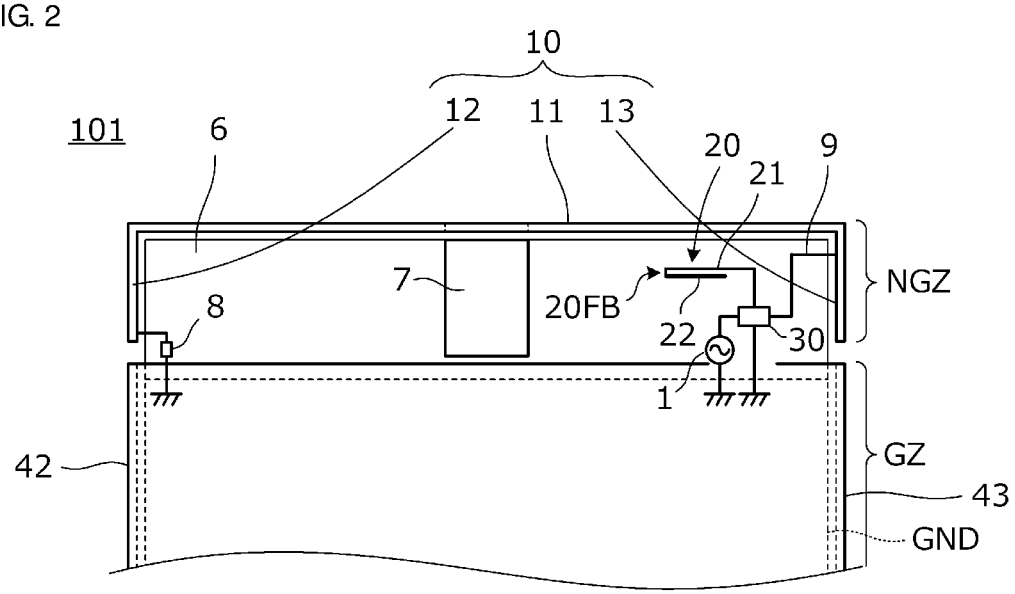
FIG. 2 is a plan view of a main portion of the antenna device 101.

FIG. 1 is a perspective view illustrating a main configuration of an antenna device 101 according to the first preferred embodiment and electronic equipment including the antenna device 101. FIG. 2 is a plan view of a main portion of the antenna device 101.

A metal housing of the electronic equipment includes a radiating element 10, which is an end portion of the metal housing, and a metal housing main portion 40. The metal housing main portion 40 includes a planar portion 41 and side surface portions 42 and 43.

The antenna device 101 includes the radiating element 10, a non-radiating resonant circuit 20, and the coupling circuit 30.

The radiating element 10 is defined by the end portion of the metal housing, and includes an end surface portion 11 and side surface portions 12 and 13. An end portion of the side surface portion 12 is connected to a ground (is grounded) of a circuit substrate 6 via an inductor 8. Although an end portion of the side surface portion 13 is open, a parasitic capacitance C is generated between this open end and the ground. Note that a connector 7, such as a USB, for example, is mounted on the circuit substrate 6, and an opening for the connector 7 is provided in the end surface portion 11. However, the connector 7 is not a component of the antenna device 101.

The circuit substrate 6 includes a ground region GZ in which a ground electrode GND is provided and a non-ground region NGZ in which a ground electrode is not provided. The end portion of the metal housing, which defines the radiating element 10, is located on the non-ground region side. In the non-ground region NGZ of the circuit substrate 6, the non-radiating resonant circuit is defined by a conductor pattern. Also in the non-ground region NGZ of the circuit substrate 6, a feeding line 9 that connects the coupling circuit 30 and the radiating element 10 to each other is provided.

As illustrated in FIG. 2, the non-radiating resonant circuit 20 is defined by a linear conductor pattern including a returning portion 20FB along the linear conductor pattern. In this manner, since the linear conductor pattern including a returning portion along the linear conductor pattern is provided, the non-radiating resonant circuit 20 is provided in a small area, and an electric length that is necessary for resonance is able to be obtained. In addition, in the present preferred embodiment, a first linear conductor pattern portion 21 extending from the coupling circuit 30 and a second linear conductor pattern portion 22 that returns to a side away from the radiating element 10 are included. With this structure, since a portion close to the radiating element 10 (the end surface portion 11 in particular) is short, and extending directions are opposite to each other, substantial coupling with the radiating element 10 (the end surface portion 11 in particular) is weak. This reduces or prevents unnecessary coupling between the non-radiating resonant circuit 20 and the radiating element 10.

Note that the second linear conductor pattern portion 22 is preferably wider than the first linear conductor pattern portion 21. Thus, a resonant bandwidth is able to be broadened.

Figure 3:
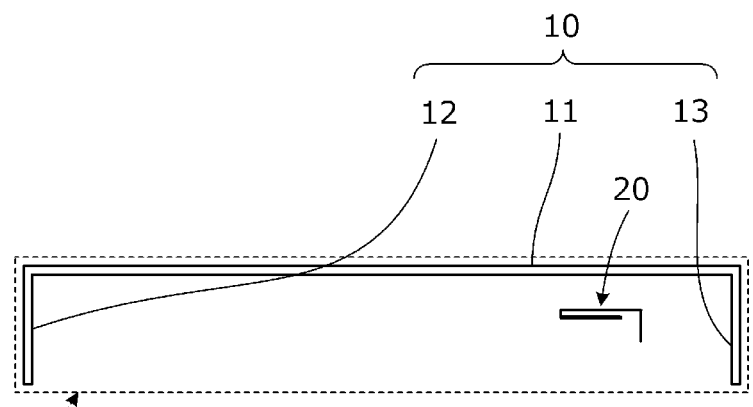
FIG. 3 is a plan view of a position at which a non-radiating resonant circuit 20 is provided.

FIG. 3 is a plan view illustrating a position at which the non-radiating resonant circuit 20 is provided. The radiating element 10 is defined by a conductive member (the end surface portion 11 and the side surface portions 12 and 13) that includes three sides in a plan view, and the non-radiating resonant circuit is surrounded by a radiating element formation region 10Z surrounded by the three sides of the radiating element 10 in a plan view. The entire or substantially the entire non-radiating resonant circuit 20 does not have to be provided within the radiating element formation region 10Z, and a about half or more of the non-radiating resonant circuit 20 is preferably included within the radiating element formation region 10Z. Since the non-radiating resonant circuit 20 is not used as a radiating element, the non-radiating resonant circuit 20 is preferably "non-radiating". Thus, in a case in which the non-radiating resonant circuit 20 is surrounded by the three sides of the conductive member in a plan view and about half or more of the non-radiating resonant circuit 20 is included within the radiating element formation region 10Z, the non-radiating resonant circuit 20 is shielded by the radiating element 10. This increases a non-radiating property of the non-radiating resonant circuit 20 seen from a distance.

Figure 4:
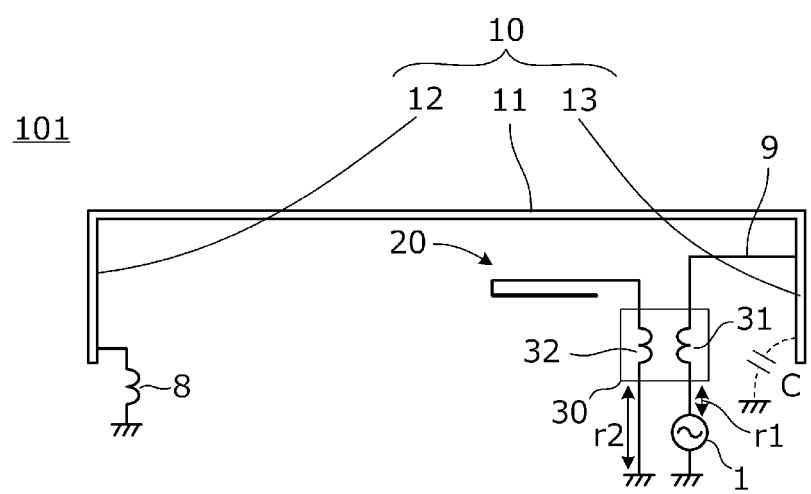
FIG. 4 illustrates a configuration of a coupling circuit 30 and a circuit connected thereto.

FIG. 4 illustrates a configuration of the coupling circuit 30 and a circuit connected thereto. The coupling circuit includes a first coupling element 31 and a second coupling element 32 that is coupled to the first coupling element 31, and a transformer is defined by the first coupling element 31 and the second coupling element 32. The first coupling element 31 and the second coupling element 32 have small inductances, each of which is preferably, for example, about 10 nH or less. The radiating element 10 and the non-radiating resonant circuit 20 are coupled to each other via the coupling circuit 30 preferably with a coupling coefficient of, for example about 0.5 or more, and more preferably with a coupling coefficient of, for example, about 0.8 or more. When the inductance of a coupling element is smaller, an influence on a circuit characteristic and a radiation characteristic of the radiating element 10 is able to be further reduced or prevented. When the coupling coefficient is higher, the radiating element 10 and the non-radiating resonant circuit 20 are able to be more electrically connected to each other, and a resonance point is able to be added to only a frequency at which the non-radiating resonant circuit 20 more largely contributes to resonance. In this manner, by configuring a transformer in which electromagnetic field coupling is produced between the first coupling element 31 and the second coupling element 32, a coupling circuit with a high coupling coefficient between the first coupling element 31 and the second coupling element 32 is provided, and a resonance characteristic of the non-radiating resonant circuit 20 when viewing the radiating element 10 from a feeder circuit 1 is likely to be shown.

The first coupling element 31 is connected between the radiating element 10 and the feeder circuit 1. A first end of the second coupling element 32 is connected to the non-radiating resonant circuit 20, and a second end thereof is connected to the ground (is grounded) of the circuit substrate 6.

With the electronic equipment according to the present preferred embodiment, the metal portion of the housing that accommodates the feeder circuit is used as the radiating element, and thus, it is unnecessary to provide a conductive member or a conductor pattern dedicated to the radiating element, thus reducing the size of the electronic equipment. In addition, also in electronic equipment including a metal housing, the metal housing does not block electromagnetic waves.

Figure 5A:
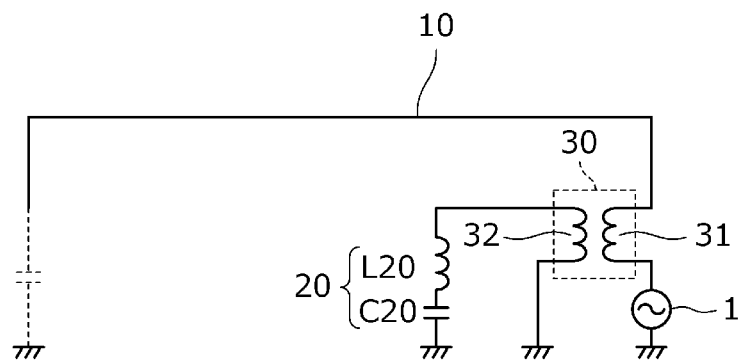
FIG. 5A is an equivalent circuit diagram of the antenna device 101 in a high band.

FIG. 5A is an equivalent circuit diagram of the antenna device 101 in a high band. In a high band (e.g., 1.6 GHz to 2.3 GHz), the inductor 8 (see FIG. 2 and FIG. 4) has a predetermined high impedance, and a tip of the radiating element 10 is equivalently open. In this state, the radiating element 10 serves as a monopole antenna that resonates at ¾ wavelengths or $(2n+1)/4$ wavelengths (n is a natural number).

Figure 5B:
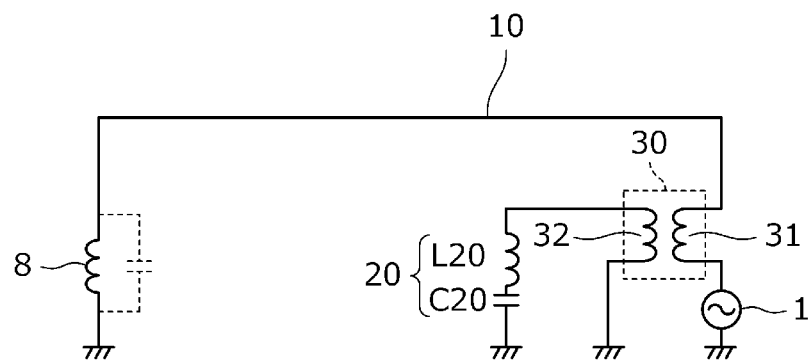
FIG. 5B is an equivalent circuit diagram of the antenna device 101 in a low band.

FIG. 5B is an equivalent circuit diagram of the antenna device 101 in a low band. In a low band (e.g., about 700 MHz to about 900 MHz), the inductor 8 has a predetermined inductance, and the tip of the radiating element 10 is grounded via the inductor 8. In this state, the radiating element 10 defines and functions as a loop antenna of one wavelength or an integer multiple thereof.

A series circuit including an inductor L20 and a capacitor C20 illustrated in FIGS. 5A and 5B is an element that represents an equivalent circuit in which the non-radiating resonant circuit 20 is simply illustrated as a lumped constant circuit. The non-radiating resonant circuit 20 defines and functions as an open stub that resonates at a predetermined frequency at about ¾ wavelengths or about $(2n+1)/4$ wavelengths (n is a natural number), for example. Thus, the inductor L20 and the capacitor C20 are used in FIGS. 5A and 5B. The non-radiating resonant circuit 20 resonates in, for example, a frequency band whose center is about 2.1 GHz, for example. Note that in the present preferred embodiment, since the non-radiating resonant circuit 20 has a shape in which the linear conductor pattern is returned, a standing wave is not provided in the linear conductor pattern compared with a simple straight line conductor pattern, and a Q value of resonance as a resonance circuit is relatively small.

Figure 6:
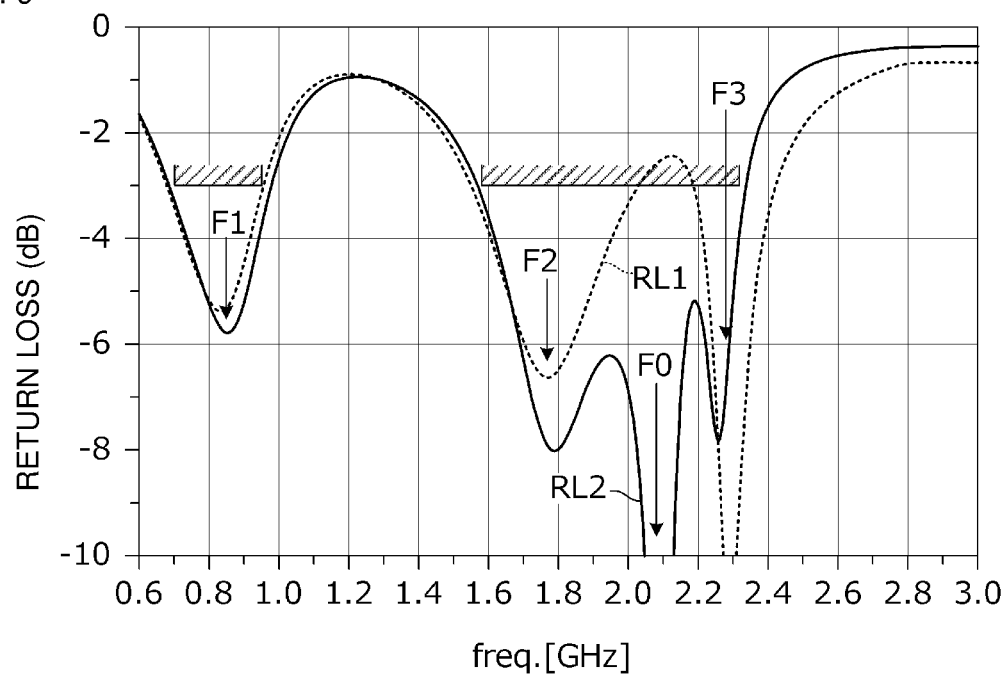
FIG. 6 illustrates a frequency characteristic of a return loss of the antenna device 101 and an antenna device of a comparative example.

FIG. 6 illustrates a frequency characteristic of a return loss of the antenna device 101 and an antenna device of a comparative example. In FIG. 6, a return loss characteristic RL1 is a return loss of the antenna device 101 according to the present preferred embodiment, and a return loss characteristic RL2 is a return loss of the antenna device according to the comparative example. The antenna device according to the comparative example is an antenna device in which the coupling circuit 30 and the non-radiating resonant circuit 20 are not included. In either antenna device, a pole is generated at a center frequency F1 of a low band (e.g., about 700 MHz to about 900 MHz). This is due to the resonance characteristic of the loop antenna illustrated in FIG. 5B. Another pole is generated at a frequency F2 (e.g., around 1.75 GHz). This is due to ¾ wavelength resonance of the monopole antenna illustrated in FIG. 5A. Another pole is generated at a frequency F3 (e.g., around 2.3 GHz). This is due to ⁵⁄₄ wavelength resonance of the monopole antenna illustrated in FIG. 5A.

Note that it is preferable that a length "r1" of a line between the first coupling element 31 and the feeder circuit 1 illustrated in FIG. 4 and a length "r2" of a line between an end portion of the second coupling element 32 and the ground are less than about ⅛ wavelength of the resonant frequency, for example. The wavelength here may mean an effective wavelength considering a wavelength shortening effect of a magnetic body or a dielectric. The threshold is set to about "⅛ wavelength" because it is practical until a condition at which ⅛ wavelength current becomes 1/√2, in other words, a power that is able to be transmitted is approximately halved, is satisfied.

Figure 7:
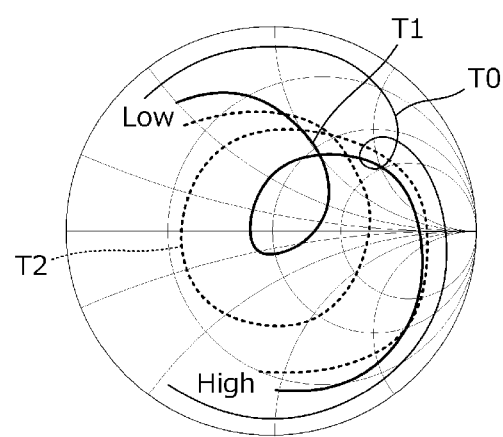
FIG. 7 is a conceptual diagram illustrating a difference in impedance matching depending on the strength of coupling of the coupling circuit.

Here, FIG. 7 illustrates a conceptual diagram of a difference in impedance matching depending on the strength of the coupling. In FIG. 7, loci T0, T1, and T2 are impedance loci representing, on a Smith chart, impedances when seeing the antenna device 101 from the feeder circuit 1. Locus T0 is a characteristic in a state in which the coupling circuit 30 and the non-radiating resonant circuit 20 are not provided, locus T1 is a characteristic in a state in which the first coupling element 31 and the second coupling element 32 of the coupling circuit 30 are appropriately coupled to each other, and locus T2 is a characteristic in a state in which the coupling between the first coupling element 31 and the second coupling element 32 of the coupling circuit 30 is too strong.

In this manner, when the coupling between the first coupling element 31 and the second coupling element 32 of the coupling circuit 30 is too strong, the input impedance seen from the feeder circuit deviates from the impedance (e.g., about 50Ω) on the feeder circuit (and transmission line) side. Therefore, it is important that the first coupling element 31 and the second coupling element 32 of the coupling circuit 30 are appropriately coupled to each other. The length "r1" of the line between the first coupling element 31 and the feeder circuit 1 and the length "r2" of the line between the end portion of the second coupling element 32 and the ground are set within a range of less than about ⅛ wavelength of the resonant frequency, and thus, the coupling by the coupling circuit 30 is able to be appropriately set.

In the antenna device 101 according to the present preferred embodiment, another pole is generated at a frequency F0 (e.g., around 2.1 GHz). This is due to the resonance characteristic of the non-radiating resonant circuit 20. That is, since the non-radiating resonant circuit 20 resonates in a frequency band whose center frequency is about 2.1 GHz, for example, the pole is generated at about 2.1 GHz in the frequency characteristic of a return loss of the antenna device 101 seen from the feeder circuit 1. With the antenna device 101 according to the present preferred embodiment, a high-band application frequency band is broadened from about 1.6 GHz to about 2.3 GHz.

In the low band, the non-radiating resonant circuit 20 does not resonate, and the return loss characteristic in the low band is not influenced. That is, the non-radiating resonant circuit 20 influences the return loss characteristic seen from the feeder circuit 1 in, for example, a frequency band of about 1.6 GHz or higher, and the non-radiating resonant circuit 20 has substantially no influence in a frequency band lower than that.

The return loss characteristic at around the frequency F0 is determined by the resonance characteristic of the non-radiating resonant circuit 20, and accordingly, the return loss characteristic at about the frequency F0 can be determined as appropriate by the shape of the conductor pattern that constitutes the non-radiating resonant circuit. In the present preferred embodiment, since the non-radiating resonant circuit 20 is defined by the linear conductor pattern that includes a returning portion along the linear conductor pattern, the sharpness of resonance of the non-radiating resonant circuit 20 is degraded, and the non-radiating resonant circuit 20 is able to attenuate a reflection coefficient in a wide band including the band in which the pole generated at the frequency F0 and its periphery.

Note that the non-radiating resonant circuit 20 that defines and functions as an open stub is provided independently or substantially independently of the radiating element 10. Thus, there is no influence on a low band, unlike in a case in which a stub is provided in the radiating element, for example.

Figure 8:
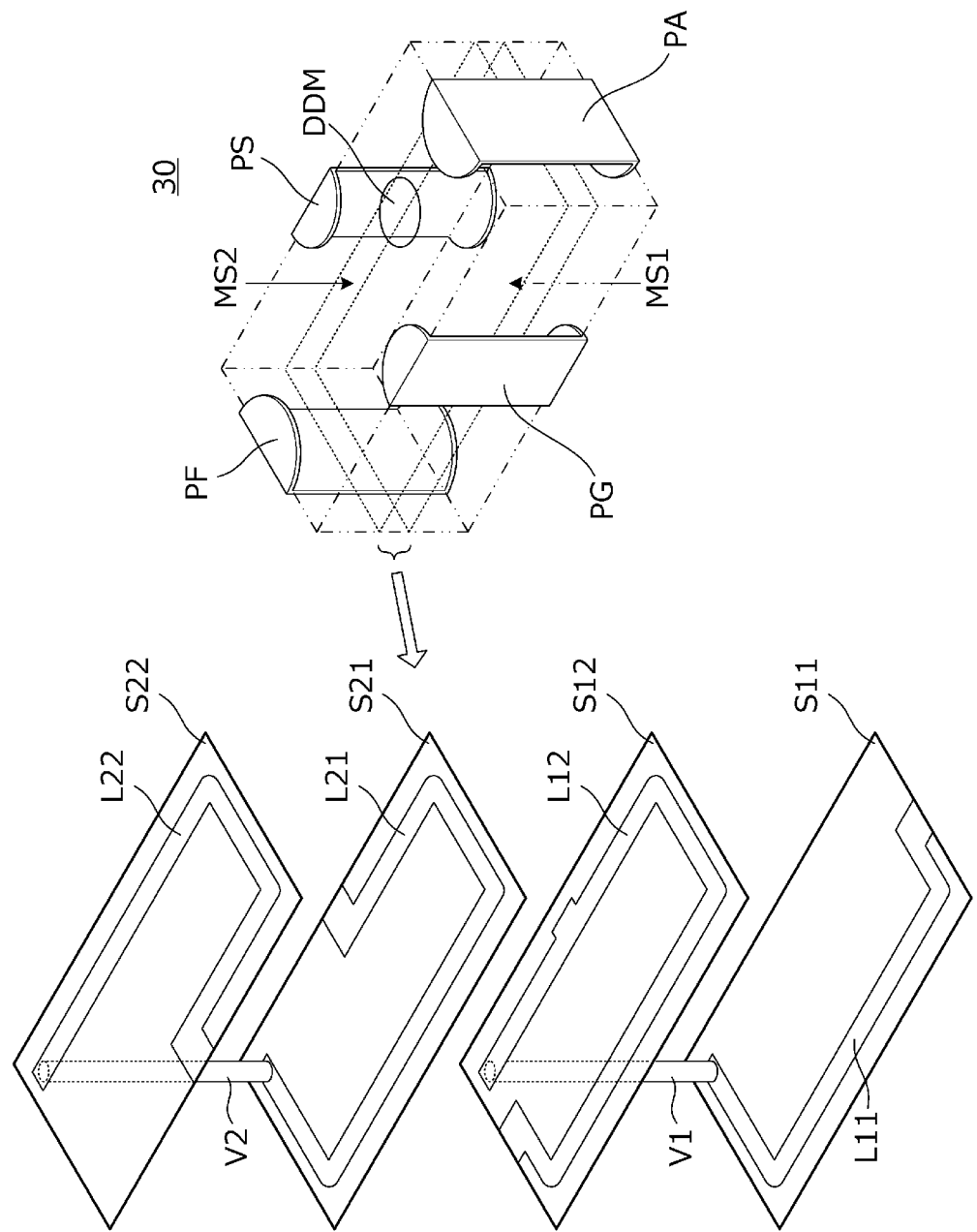
FIG. 8 is a perspective view of the coupling circuit 30.
Figure 9:
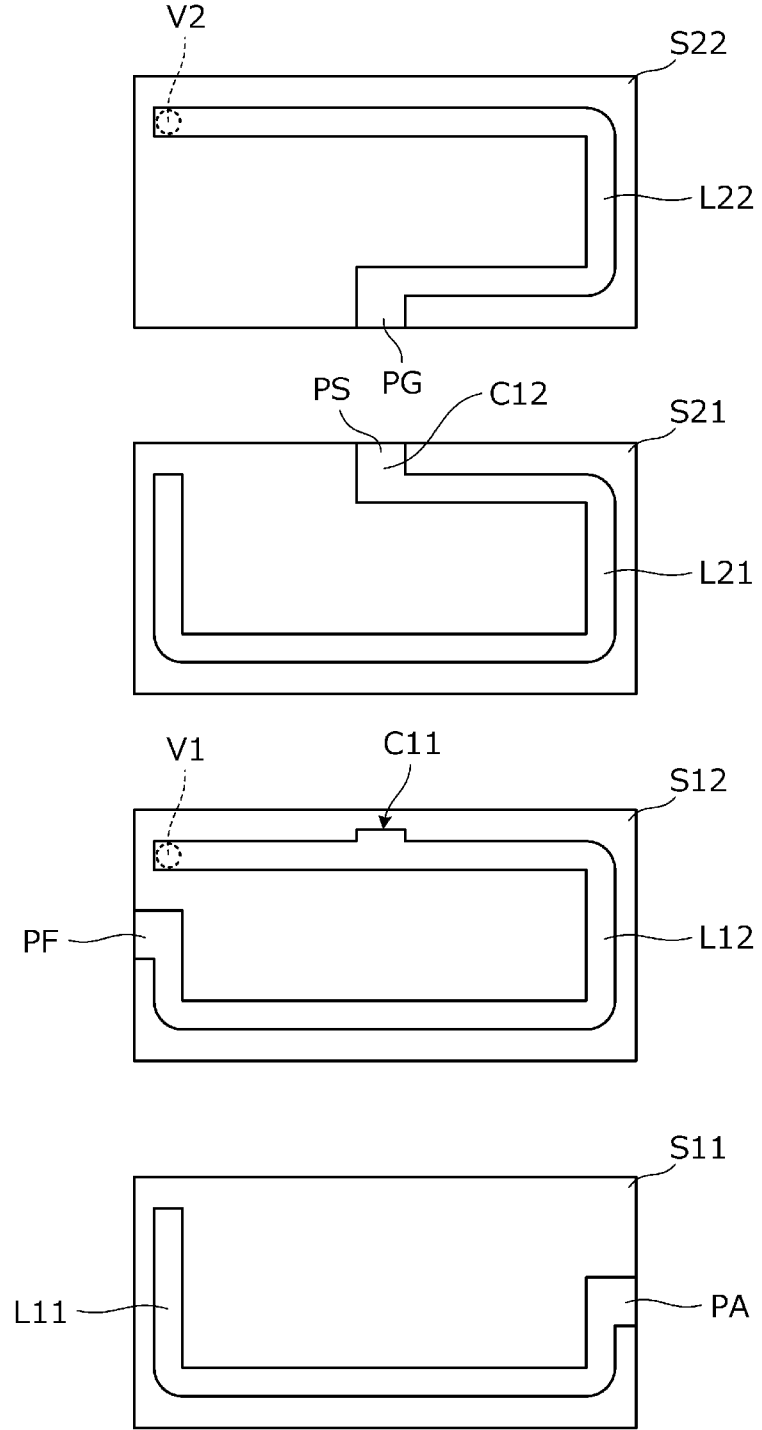
FIG. 9 is exploded plan views illustrating some conductor patterns provided on layers of the coupling circuit.

Next, a configuration of the coupling circuit 30 will be described. FIG. 8 is a perspective view of the coupling circuit 30, and FIG. 9 is an exploded plan view illustrating conductor patterns provided on layers of the coupling circuit.

The coupling circuit 30 included in the antenna device according to the present preferred embodiment is preferably, for example, a rectangular or substantially rectangular parallelepiped chip component to be mounted on the circuit substrate 6. In FIG. 8, an external configuration of the coupling circuit 30 and an internal structure thereof are separately illustrated. The external configuration of the coupling circuit 30 is represented by a two-dotted-and-dashed line. On an outer surface of the coupling circuit 30, a feeder circuit connection terminal PF, a radiating element connection terminal PA, a ground terminal PG, and a non-radiating resonant circuit connection terminal PS are provided. In addition, the coupling circuit 30 includes a first surface MS1 and a second surface MS2 that is opposed to the first face. In the present preferred embodiment, the first surface MS1 is a mount surface, and this surface faces a circuit substrate. On a top surface (second surface) that is opposed to the mount surface (first surface) MS1, a direction discrimination mark DDM is provided. This direction discrimination mark DDM is used to detect a direction of a chip component when, for example, the coupling circuit 30 is mounted as the chip component on a circuit substrate by a mounter.

Inside the coupling circuit 30, a first conductor pattern L11, a second conductor pattern L12, a third conductor pattern L21, and a fourth conductor pattern L22 are provided. The first conductor pattern L11 and the second conductor pattern L12 are connected to each other by an interlayer connection conductor V1. The third conductor pattern L21 and the fourth conductor pattern L22 are connected to each other by an interlayer connection conductor V2. Note that FIG. 8 illustrates insulating materials S11, S12, S21, and S22, on which the respective conductor patterns are provided, separately in a stacking direction.

These insulating materials S11, S12, S21, and S22 may preferably be a non-magnetic ceramic multi-layer body made of, for example, LTCC (Low Temperature Co-fired Ceramics) or other suitable material, or may be a resin multi-layer body preferably made of, for example, a resin material, such as polyimide or liquid crystal polymer. In this manner, since the material layers are non-magnetic (not a magnetic ferrite), it is possible to use the material layers for a coupling circuit even in a high frequency band exceeding several hundreds of MHz.

Each of the conductor patterns and the interlayer connection conductors is preferably made of, for example, a conductor material including Ag or Cu as a main component and having a small resistivity. In a case in which the material layers are ceramic, for example, the conductor patterns and the interlayer connection conductors are formed by screen printing and firing of a conductive paste including Ag or Cu as a main component. In a case in which the material layers are resin, for example, the conductor patterns and the interlayer connection conductors are patterned by etching or other suitable method of a metal foil, such as an Al foil or a Cu foil, for example.

As illustrated in FIG. 9, the first conductor pattern L11, the second conductor pattern L12, the third conductor pattern L21, and the fourth conductor pattern L22 are provided in this order from a layer close to the mount surface. A first end of the first conductor pattern L11 is connected to the radiating element connection terminal PA, and a second end thereof is connected to a first end of the second conductor pattern L12 via the interlayer connection conductor V1. A second end of the second conductor pattern L12 is connected to the feeder circuit connection terminal PF. In addition, a first end of the third conductor pattern L21 is connected to a non-radiating resonant circuit connection terminal PS, and a second end of the third conductor pattern L21 is connected to a first end of the fourth conductor pattern L22 via the interlayer connection conductor V2. A second end of the fourth conductor pattern L22 is connected to the ground terminal PG.

In addition, a winding direction of the first coupling element 31 from the feeder circuit connection terminal PF to the radiating element connection terminal PA and a winding direction of the second coupling element 32 from the non-radiating resonant circuit connection terminal PS to the ground terminal PG are opposite to each other. That is, a magnetic field (magnetic flux) generated when current flows in the first coupling element 31 from the feeder circuit connection terminal PF to the radiating element connection terminal PA and a magnetic field (magnetic flux) generated when current flows in the second coupling element 32 from the non-radiating resonant circuit connection terminal PS to the ground terminal PG weaken each other. Here, when the radiating element connection terminal PA resonates as a monopole antenna, the first coupling element 31 and the second coupling element 32 have opposite polarities in the coupling circuit 30 that is connected via the feeder circuit 1 and the ground electrode GND. Current flows in the first coupling element 31 from the feeder circuit connection terminal PF to the radiating element connection terminal PA, and current flows in the second coupling element 32 from the non-radiating resonant circuit connection terminal PS to the ground terminal PG. Magnetic fields (magnetic fluxes) that are generated weaken each other. Thus, a mutual inductance due to the coupling between the first coupling element 31 and the second coupling element 32 decreases the inductances of the first coupling element 31 and the second coupling element 32, so as to have little influence on the circuit characteristic and the radiation characteristic of the radiating element 10.

Figure 10:
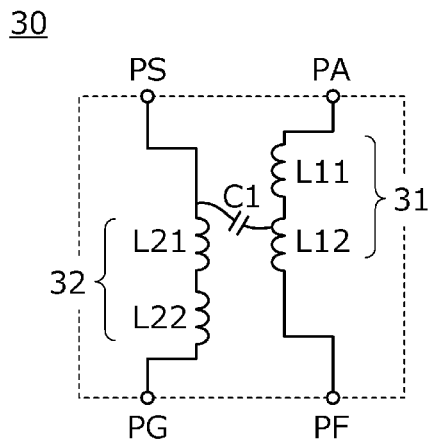
FIG. 10 is a circuit diagram of the coupling circuit 30 including four coil conductor patterns.

FIG. 10 is a circuit diagram of the coupling circuit 30 including the four coil conductor patterns. The second conductor pattern L12 and the first conductor pattern L11 are connected in series to define the first coupling element 31. Similarly, the fourth conductor pattern L22 and the third conductor pattern L21 are connected in series to define the second coupling element 32. The second conductor pattern L12 and the third conductor pattern L21 are adjacent to each other in the thickness direction, and the magnetic field coupling between the second conductor pattern L12 and the third conductor pattern L21 is particularly strong. Thus, the second conductor pattern L12 and the third conductor pattern L21 are adjacent to each other in FIG. 10. Obviously, magnetic field coupling is established between the second conductor pattern L12 and the fourth conductor pattern L22 and between the first conductor pattern L11 and the third conductor pattern L21.

In the example illustrated in FIG. 9, a capacitor formation conductor pattern C11 is provided in a portion of the second conductor pattern L12, and a capacitor formation conductor pattern C12 is provided in a portion of the third conductor pattern L21. Accordingly, as illustrated in FIG. 10, a capacitor C1 is provided between a middle of the second conductor pattern L12 and the non-radiating resonant circuit connection terminal PS. The capacitor C1 defines and functions as an impedance matching circuit between the feeder circuit 1 and the non-radiating resonant circuit 20.

Second Preferred Embodiment

Figure 11:
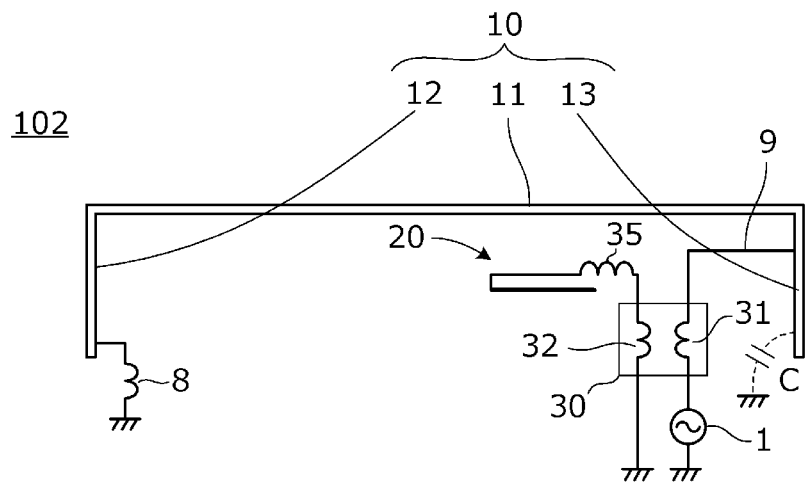
FIG. 11 illustrates a circuit configuration of an antenna device 102 according to a second preferred embodiment of the present invention.

FIG. 11 illustrates a circuit configuration of an antenna device 102 according to the second preferred embodiment of the present invention. In the antenna device 102, an inductor 35 is connected (inserted) between the second coupling element 32 of the coupling circuit 30 and the non-radiating resonant circuit 20. The remaining configuration is the same as or similar to that of the circuit illustrated in FIG. 4 in the first preferred embodiment.

According to the present preferred embodiment, since the inductor 35 is provided to a portion at which current is low, while a change in the coupling of the coupling circuit 30 is reduced or prevented, the resonant frequency of the non-radiating resonant circuit 20 is able to be decreased, and a desired communication band is able to be obtained. Alternatively, while the resonant frequency is maintained, the length of the non-radiating resonant circuit 20 is able to be reduced, and thus the area used is able to be reduced.

Note that the inductor 35 may also be integrated with the coupling circuit 30. However, it is preferable that the inductor 35 is not coupled to the first coupling element 31.

Third Preferred Embodiment

Figure 12:
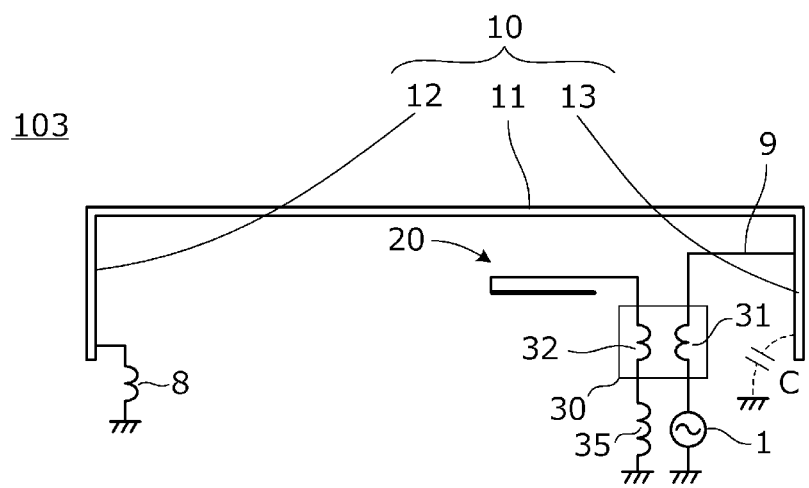
FIG. 12 illustrates a circuit configuration of an antenna device 103 according to a third preferred embodiment of the present invention.

FIG. 12 illustrates a circuit configuration of an antenna device 103 according to a third preferred embodiment of the present invention. In the antenna device 103, the inductor 35 is connected (inserted) between the second coupling element 32 of the coupling circuit 30 and the ground. The remaining configuration is the same as or similar to that of the circuit illustrated in FIG. 4 in the first preferred embodiment.

When the coupling circuit 30 is added to the antenna device, a parasitic capacitance is generated between the ground and the coupling circuit 30. According to the present preferred embodiment, resonance between the inductor 35 and the parasitic capacitance reduce or prevent a reactance component. Therefore, in a frequency band in which an antenna characteristic is not to be changed by addition of the coupling circuit 30 to the antenna device, by providing the inductor 35 with such an inductance as to resonate with the parasitic capacitance, a change from a matching state in which the coupling circuit 30 is not mounted is able to be reduced or prevented.

In addition, the inclusion of the inductor 35 is able to decrease the resonant frequency of the non-radiating resonant circuit 20, and a desired communication band or communication characteristic is able to be obtained. Alternatively, while the resonant frequency is maintained, the length of the antenna is able to be reduced, and the area used is able to be reduced.

Note that the inductor 35 may also be integrated with the coupling circuit 30. However, it is preferable that the inductor 35 is not coupled to the first coupling element 31.

Fourth Preferred Embodiment

Figure 13:
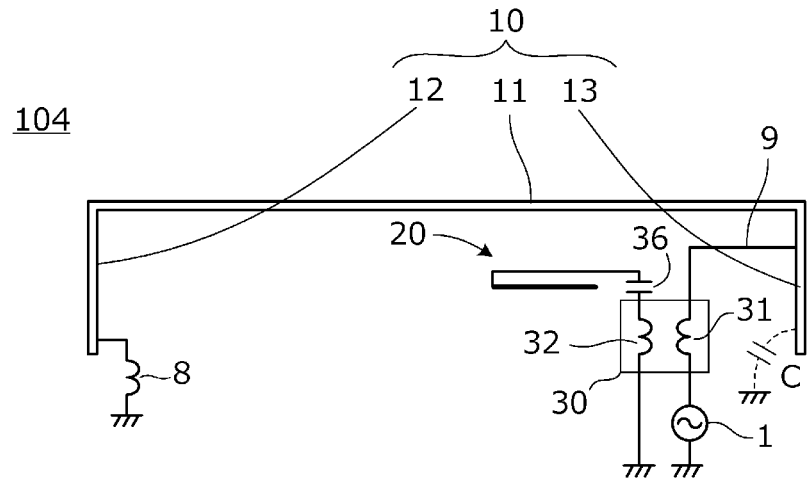
FIG. 13 illustrates a circuit configuration of an antenna device 104 according to a fourth preferred embodiment of the present invention.

FIG. 13 illustrates a circuit configuration of an antenna device 104 according to a fourth preferred embodiment of the present invention. In the antenna device 104, a capacitor 36 is connected (inserted) between the second coupling element 32 of the coupling circuit 30 and the non-radiating resonant circuit 20. The remaining configuration is the same as or similar to that of the circuit illustrated in FIG. 4 in the first preferred embodiment.

According to the present preferred embodiment, the resonant frequency on the non-radiating resonant circuit side is able to be increased, and a desired communication band is able to be obtained.

Note that the capacitor 36 may be integrated with the coupling circuit 30.

Fifth Preferred Embodiment

Figure 14:
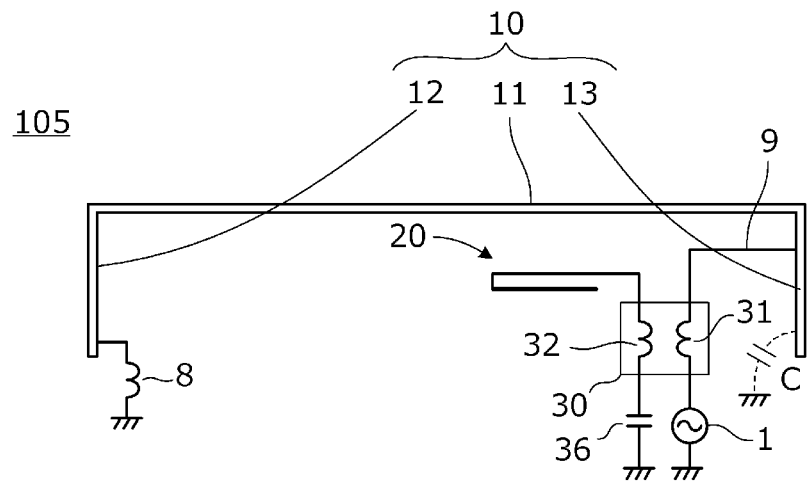
FIG. 14 illustrates a circuit configuration of an antenna device 105 according to a fifth preferred embodiment of the present invention.

FIG. 14 illustrates a circuit configuration of an antenna device 105 according to a fifth preferred embodiment of the present invention. In the antenna device 105, the capacitor 36 is connected (inserted) between the second coupling element 32 of the coupling circuit 30 and the ground. The remaining configuration is the same as or similar to that of the circuit illustrated in FIG. 4 in the first preferred embodiment.

According to the present preferred embodiment, a parasitic capacitance generated between the ground and the coupling circuit 30 by inclusion of the coupling circuit 30 is able to be reduced (combined capacitance is able to be reduced), and a change from a matching state in which the coupling circuit 30 is not provided is able to be reduced or prevented. In addition, the resonant frequency of the non-radiating resonant circuit 20 is able to be increased, and a desired communication band or communication characteristic is able to be obtained.

Note that the capacitor 36 may be integrated with the coupling circuit 30.

Sixth Preferred Embodiment

Figure 15:
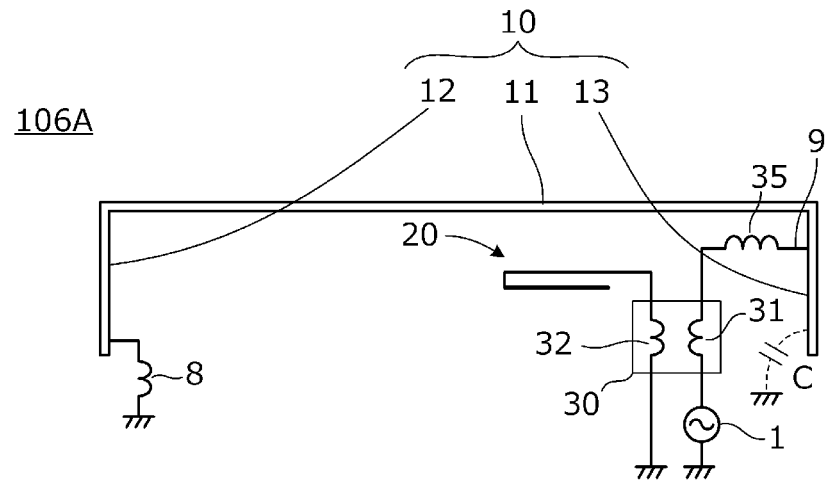
FIG. 15 illustrates a circuit configuration of an antenna device 106A according to a sixth preferred embodiment of the present invention.

FIG. 15 illustrates a circuit configuration of an antenna device 106A according to a sixth preferred embodiment of the present invention. In the antenna device 106A, the inductor 35 is connected (inserted) between the first coupling element 31 of the coupling circuit 30 and the radiating element 10. The remaining configuration is the same as or similar to that of the circuit illustrated in FIG. 4 in the first preferred embodiment.

With the configuration of the antenna device 106A, the first coupling element 31 is closer to the feeder circuit 1, at which the current is strong, than the inductor 35 is. Thus, while a power ratio to be supplied to the non-radiating resonant circuit 20 is maintained, the resonant frequency of the radiating element 10 is able to be changed, and a level of impedance matching is able to be adjusted. In addition, a self-resonant frequency that is determined by the inductances of the first coupling element 31 and the second coupling element 32 and the parasitic capacitance generated between the first coupling element 31 and the second coupling element 32 is unlikely to be decreased, and thus, the self-resonant frequency does not adversely affect the use in a communication frequency band. That is, in a state of self-resonance, energy in the frequency band falls to the ground and is not radiated. However, in a state in which the self-resonant frequency is higher than the communication frequency band, such a problem does not arise.

Figure 16:
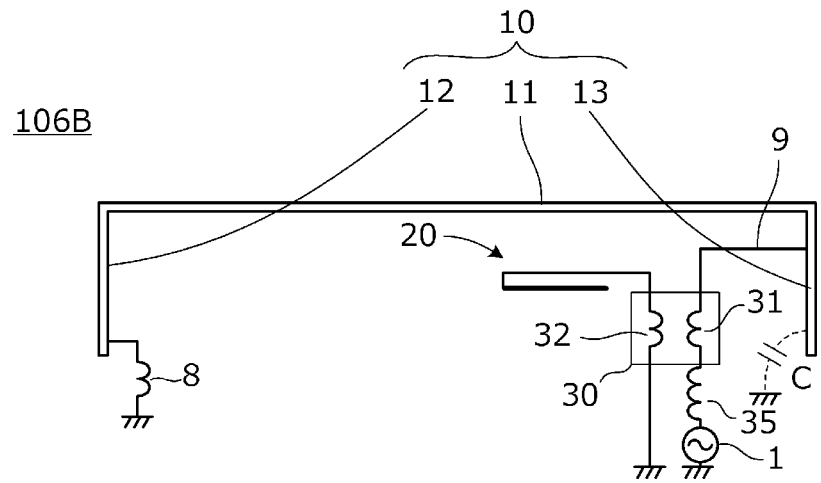
FIG. 16 illustrates a circuit configuration of an antenna device 106B according to the sixth preferred embodiment of the present invention.

FIG. 16 illustrates a circuit configuration of an antenna device 106B according to the sixth preferred embodiment. In the antenna device 106B, the inductor 35 is connected (inserted) between the first coupling element 31 of the coupling circuit 30 and the feeder circuit 1. The remaining configuration is the same as or similar to that of the circuit illustrated in FIG. 4 in the first preferred embodiment.

With the configuration of the antenna device 106B, since the first coupling element 31 of the coupling circuit 30 is disposed to a side at which current is weaker than that at the position of the inductor 35, compared with a case in which the inductor is disposed between the radiating element 10 and the first coupling element 31, it is possible to adjust the level of impedance matching as appropriate in resonance (resonant frequency) added by the coupling circuit 30 and the non-radiating resonant circuit 20. Specifically, it is possible to avoid a situation in which an input impedance excessively changes and the impedance is no longer matched.

In addition, the inclusion of the inductor 35 is able to decrease the self-resonant frequency of the coupling circuit 30, and thus, by setting the self-resonant frequency to a frequency band that is not desired to be radiated, unnecessary radiation is able to be reduced or prevented.

Figure 17:
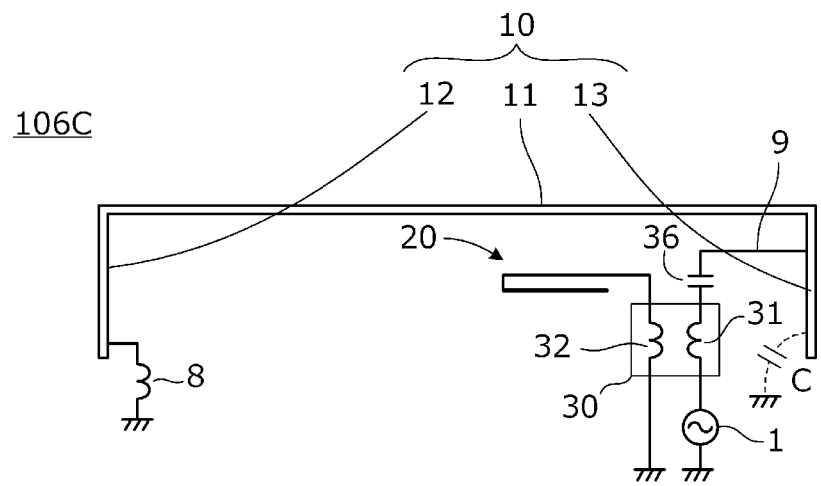
FIG. 17 illustrates a circuit configuration of an antenna device 106C according to the sixth preferred embodiment of the present invention.

FIG. 17 illustrates a circuit configuration of an antenna device 106C according to the sixth preferred embodiment. In the antenna device 106C, the capacitor 36 is connected (inserted) between the first coupling element 31 of the coupling circuit 30 and the radiating element 10. The remaining configuration is the same as or similar to that of the circuit illustrated in FIG. 4 in the first preferred embodiment.

With the configuration of the antenna device 106C, by the capacitance of the capacitor 36, the resonant frequency of the radiating element 10 is able to be adjusted, and the level of impedance matching is able to be adjusted.

Figure 18:
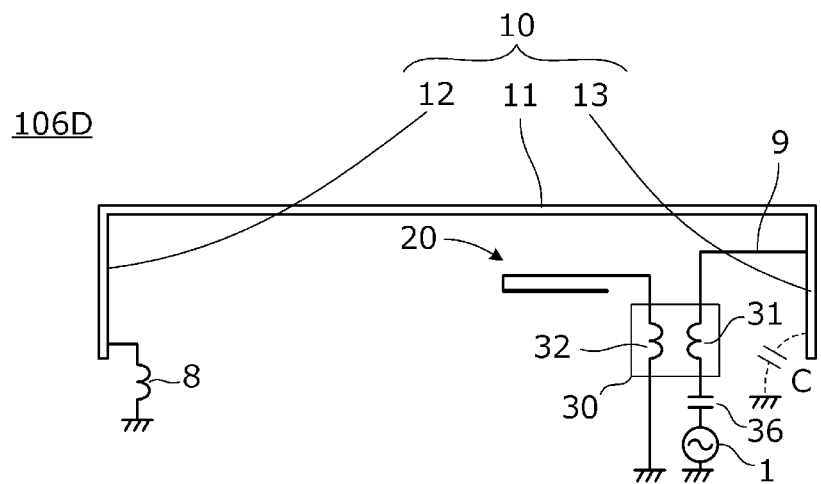
FIG. 18 illustrates a circuit configuration of an antenna device 106D according to the sixth preferred embodiment of the present invention.

FIG. 18 illustrates a circuit configuration of an antenna device 106D according to the sixth preferred embodiment. In the antenna device 106D, the capacitor 36 is connected (inserted) between the first coupling element 31 of the coupling circuit 30 and the feeder circuit 1. The remaining configuration is the same as or similar to that of the circuit illustrated in FIG. 4 in the first preferred embodiment.

With the configuration of the antenna device 106D, by the capacitance of the capacitor 36, the resonant frequency of the radiating element 10 is able to be adjusted, and the level of impedance matching is able to be adjusted. In addition, since the capacitor 36 is disposed between the feeder circuit 1 and the first coupling element 31, a parasitic capacitance generated between the first coupling element 31 and the second coupling element 32 and the capacitor 36 are connected in series. Accordingly, a combined capacitance included in a self-resonant circuit system is decreased, and the self-resonant frequency is increased. Thus, the self-resonant frequency is able to be excluded from the communication band to be used.

Seventh Preferred Embodiment

Figure 19A:
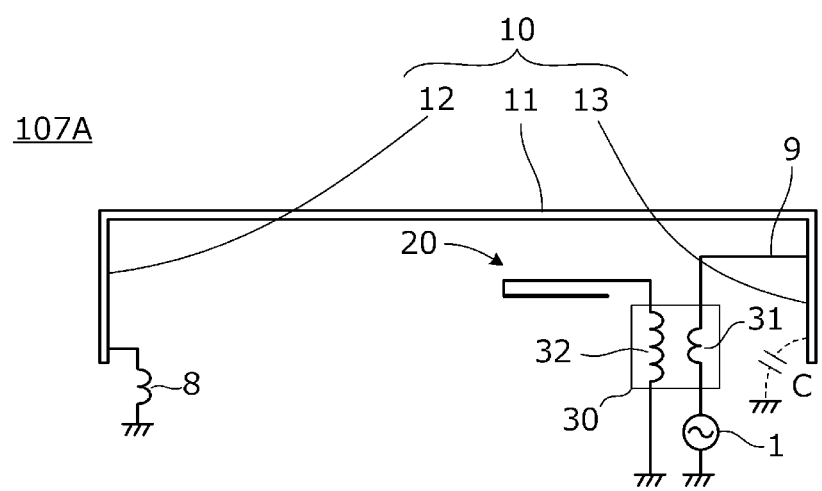
FIG. 19A illustrates a circuit configuration of an antenna device 107A according to a seventh preferred embodiment.
Figure 19B:
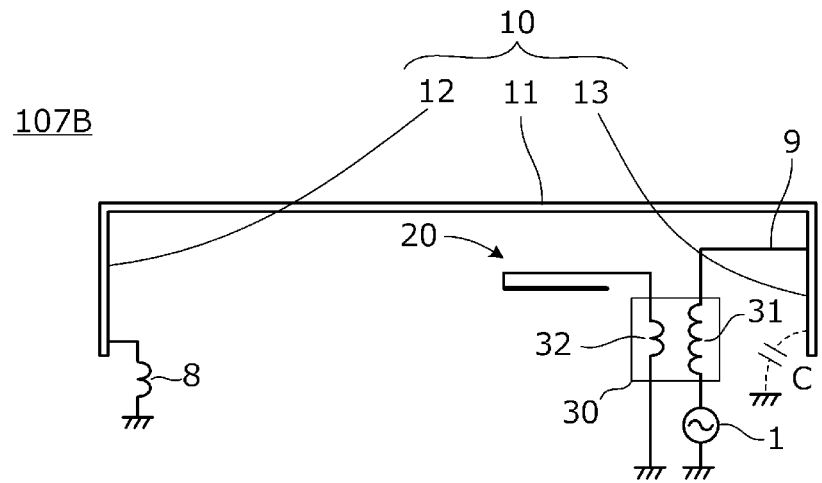
FIG. 19B illustrates a circuit configuration of an antenna device 107B according to the seventh preferred embodiment of the present invention.

FIG. 19A illustrates a circuit configuration of an antenna device 107A according to a seventh preferred embodiment of the present invention, and FIG. 19B illustrates a circuit configuration of an antenna device 107B according to the seventh preferred embodiment. The configuration of these antenna devices 107A and 107B is the same as or similar to that of the circuit illustrated in FIG. 4 in the first preferred embodiment. However, when a self-inductance of the first coupling element 31 of the coupling circuit 30 is represented as L1 and a self-inductance of the second coupling element 32 is represented as L2, the first coupling element 31 and the second coupling element 32 of the coupling circuit 30 preferably have a relationship of L2>L1 in the antenna device 107A, and a relationship of L2<L1 in the antenna device 107B. With the relationship of L2>L1, compared with a case in which L1=L2, the resonant frequency of the non-radiating resonant circuit 20 is able to be decreased. Alternatively, when comparison is made at the same resonant frequency, the non-radiating resonant circuit 20 is able to be shortened.

In addition, when L2>L1, compared with a configuration in which the inductor is connected (added) to the second coupling element 32 outside the coupling circuit 30, the entire or substantially the entire second coupling element 32 with a relatively large self-inductance contributes to the coupling with the first coupling element 31. Thus, a power ratio to be supplied to the non-radiating resonant circuit 20 is able to be increased.

In addition, when L2<L1, compared with a configuration in which the inductor is connected (added) to the first coupling element 31 outside the coupling circuit 30, the entire or substantially the entire first coupling element 31 with a relatively large self-inductance contributes to the coupling with the second coupling element 32. Thus, a power ratio to be supplied to the non-radiating resonant circuit 20 is able to be increased.

Figure 20:
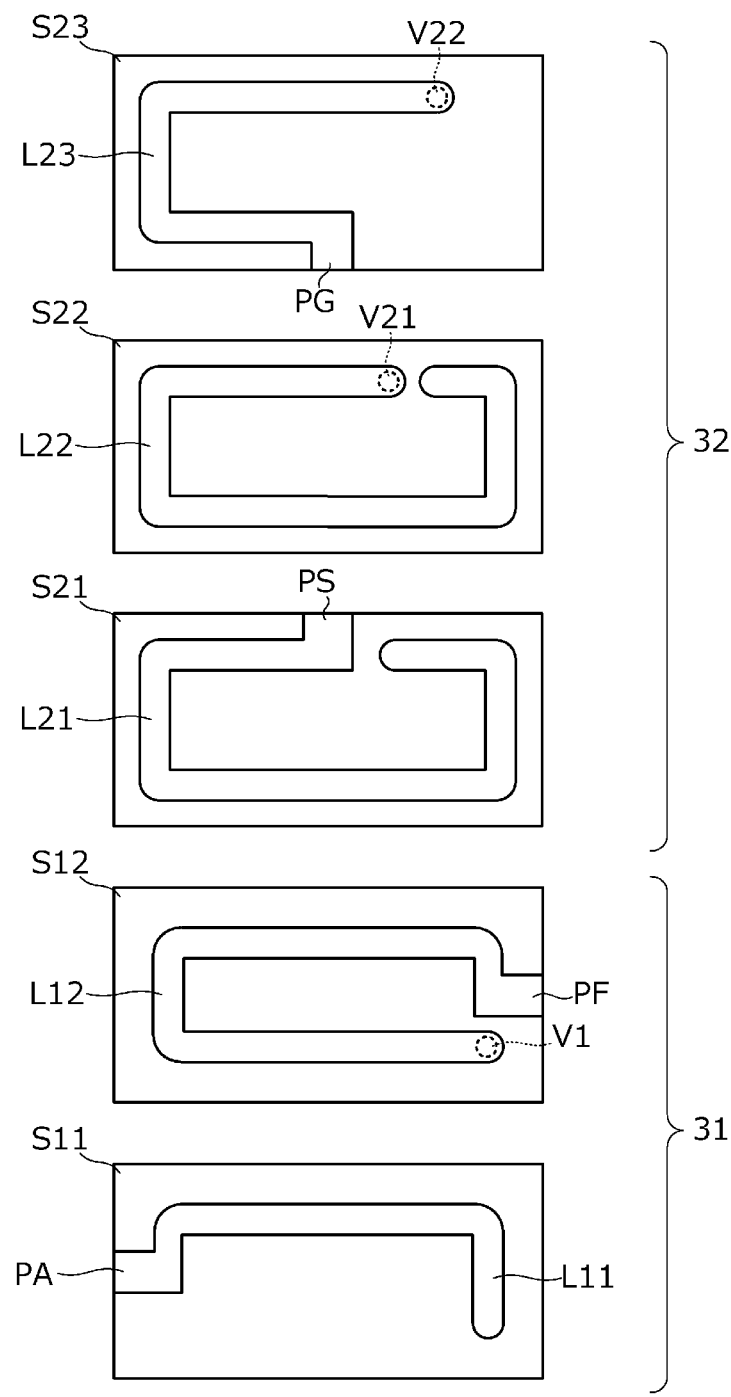
FIG. 20 is an exploded plan view illustrating conductor patterns provided on layers of the coupling circuit 30 according to the seventh preferred embodiment of the present invention.

FIG. 20 is an exploded plan view illustrating conductor patterns provided on layers of the coupling circuit 30 according to the present preferred embodiment. The coupling circuit 30 included in an antenna device according to the present preferred embodiment is preferably, for example, a rectangular or substantially rectangular parallelepiped chip component to be mounted on a circuit substrate.

On insulating materials S11, S12, S21, S22, and S23, conductor patterns L11, L12, L21, L22, and L23 are respectively provided. A first end of the conductor pattern L11 is connected to the radiating element connection terminal PA, and a second end thereof is connected to a first end of the conductor pattern L12 via the interlayer connection conductor V1. A second end of the conductor pattern L12 is connected to the feeder circuit connection terminal PF. A first end of the conductor pattern L21 is connected to the non-radiating resonant circuit connection terminal PS, and a second end thereof is connected to a first end of the conductor pattern L22 via an interlayer connection conductor V21. A second end of the conductor pattern L22 is connected to a first end of the conductor pattern L23 via an interlayer connection conductor V22. A second end of the conductor pattern L23 is connected to the ground terminal PG.

Figure 21:
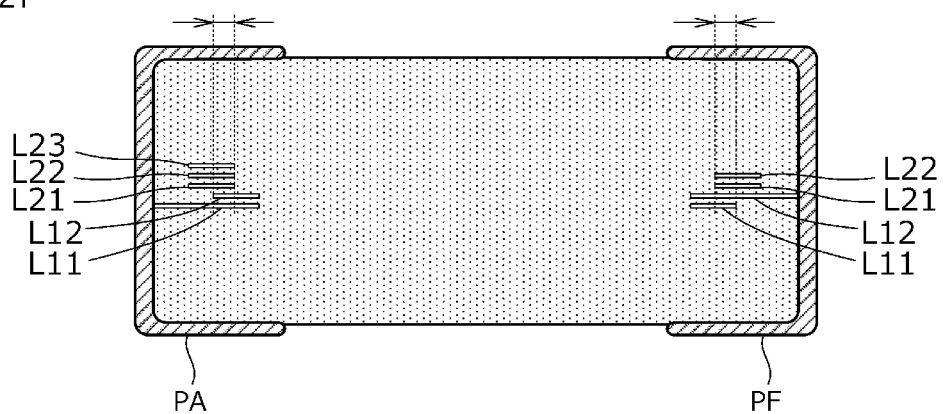
FIG. 21 is a sectional view of the coupling circuit 30 according to the seventh preferred embodiment of the present invention.
Figure 22:
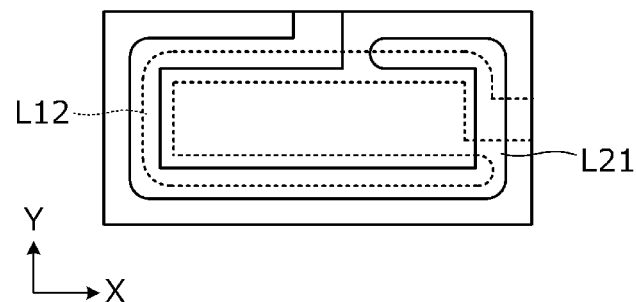
FIG. 22 is a plan view illustrating overlap between a conductor pattern L12 and a conductor pattern L21 in particular in the coupling circuit 30 according to the seventh preferred embodiment of the present invention.

FIG. 21 is a sectional view of the coupling circuit 30. FIG. 22 is a plan view illustrating overlap between the conductor pattern L12 and the conductor pattern L21 in particular. A coil opening or a coil diameter of the conductor patterns L11 and L12 of the first coupling element 31 is smaller than a coil opening or a coil diameter of the conductor patterns L21, L22, and L23 of the second coupling element 32. In addition, portions of the conductor patterns L11 and L12 and the conductor patterns L21, L22, and L23 overlap with each other. In the example illustrated in FIG. 21 and FIG. 22, about ½ of the width of the conductor patterns is overlapped along the entire or substantially the entire circumference.

Figure 23:
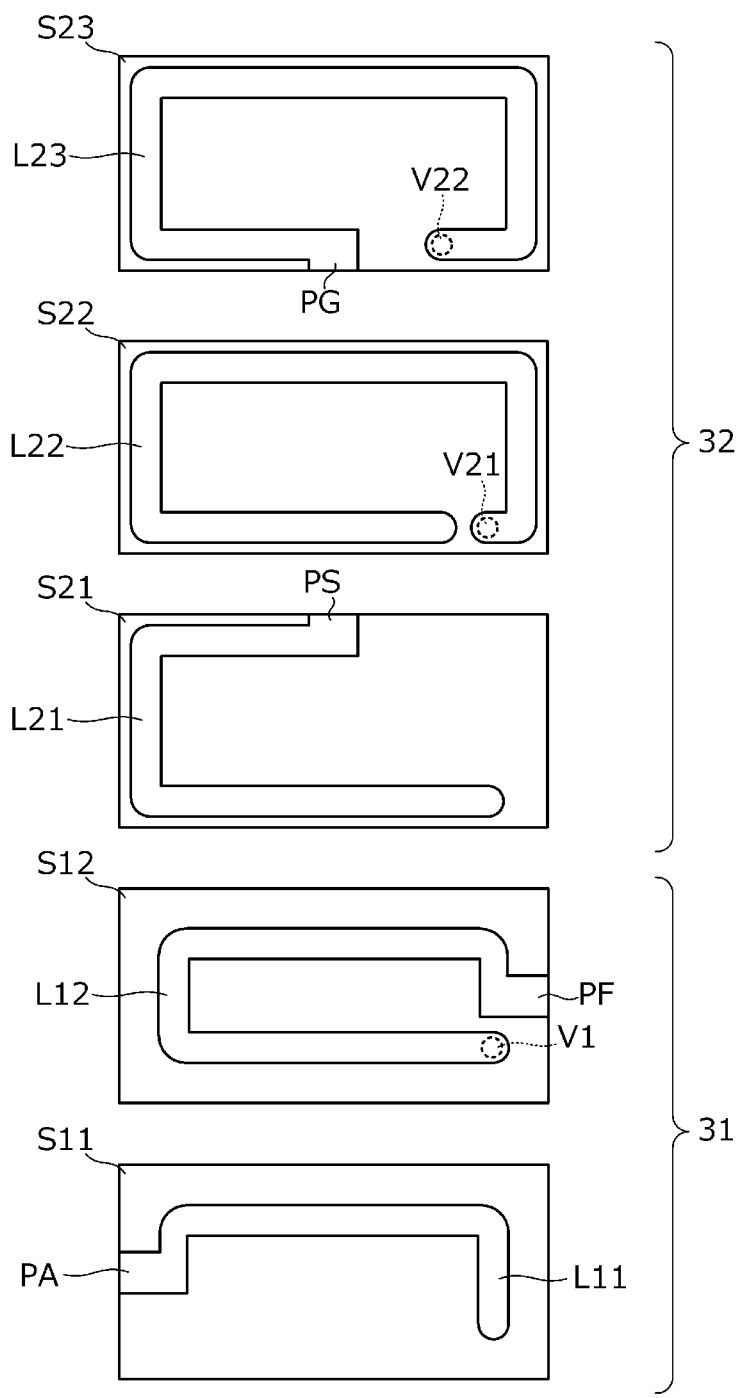
FIG. 23 is an exploded plan view illustrating conductor patterns provided on layers of another coupling circuit 30 according to the seventh preferred embodiment of the present invention.

FIG. 23 is an exploded plan view illustrating conductor patterns provided on layers of another coupling circuit 30 according to the seventh preferred embodiment. The shape and size of the conductor patterns differ from those in the example illustrated in FIG. 20. Among the conductor patterns of the coupling circuit illustrated in FIG. 23, a coil outer diameter of the conductor patterns L11 and L12 of the first coupling element 31 is smaller than a coil inner diameter of the conductor patterns L21, L22, and L23 of the second coupling element 32.

With the configuration illustrated in FIG. 20 to FIG. 23, a parasitic capacitance generated between the conductor patterns (L11 and L12) of the first coupling element 31 and the conductor patterns (L21, L22, and L23) of the second coupling element 32 is reduced or prevented. Accordingly, the self-resonant frequency determined by the inductances of the first coupling element 31 and the second coupling element 32 and the above parasitic capacitance is increased, and the self-resonant frequency is able to be excluded from the communication band to be used. In addition, even if the conductor patterns (L11 and L12) of the first coupling element 31 and the conductor patterns (L21, L22, and L23) of the second coupling element 32 are misaligned in a plane direction (X-Y plane direction illustrated in FIG. 22), the portion at which the coil opening of the first coupling element 31 and the coil opening of the second coupling element 32 overlap with each other is consistently maintained. Accordingly, only a small change in the coupling degree of magnetic field coupling between the first coupling element 31 and the second coupling element 32 is produced by plane-direction misalignment of the conductor patterns (L11 and L12) constituting the first coupling element 31 and the conductor patterns (L21, L22, and L23) constituting the second coupling element 32.

The examples in FIG. 20 and FIG. 23 are both examples of a coupling circuit in which the relationship L1<L2 is satisfied. When L1>L2, the first coupling element 31 may be defined by conductor patterns having a relatively large coil opening.

Note that FIG. 20 and FIG. 23 illustrate examples in which an influence due to misalignment of the conductor patterns (L11 and L12) of the first coupling element 31 and the conductor patterns (L21, L22, and L23) of the second coupling element 32 is reduced. Similarly, an influence due to plane-direction misalignment of the conductor patterns of the first coupling element 31 and an influence due to plane-direction misalignment of the conductor patterns of the second coupling element 32 is able to be reduced. For example, coil openings or coil diameters of the conductor patterns L11 and L12 that are adjacent to each other in the stacking direction may differ from each other, and portions of line width thereof may overlap with each other in the structure. Similarly, for example, coil openings or coil diameters of the conductor patterns L21, L22, and L23 that are adjacent to one another in the stacking direction may differ from one another, and portions of line width thereof may overlap with one another in the structure.

Eighth Preferred Embodiment

Figure 24:
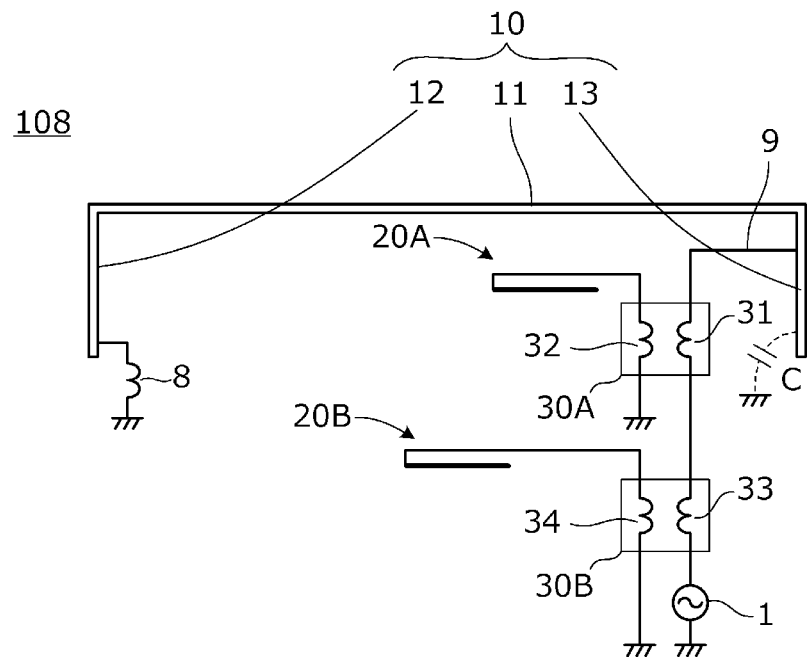
FIG. 24 illustrates a circuit configuration of an antenna device 108 according to an eighth preferred embodiment of the present invention.

FIG. 24 illustrates a circuit configuration of an antenna device 108 according to an eighth preferred embodiment of the present invention. The antenna device 108 includes a first coupling circuit 30A, a second coupling circuit 30B, a first non-radiating resonant circuit 20A, and a second non-radiating resonant circuit 20B. The second coupling circuit 30B includes a third coupling element 33 and a fourth coupling element 34 that are coupled to each other. The third coupling element 33 of the second coupling circuit 30B is connected between the first coupling element 31 and the feeder circuit 1. The first non-radiating resonant circuit 20A is connected to the second coupling element 32, and the second non-radiating resonant circuit 20B is connected to the fourth coupling element 34. The remaining configuration is the same as or similar to that of the circuit illustrated in FIG. 4 in the first preferred embodiment.

A resonant frequency of the first non-radiating resonant circuit 20A and a resonant frequency of the second non-radiating resonant circuit 20B differ from each other, and thus, a plurality of poles in accordance with these resonant frequencies are generated, and a communication bandwidth is broadened. In addition, if the resonant frequency of the first non-radiating resonant circuit 20A and the resonant frequency of the second non-radiating resonant circuit 20B are equal or substantially equal to each other, the poles generated in the two non-radiating resonant circuits become deeper, and impedance matching in this frequency band is improved.

Ninth Preferred Embodiment

Figure 25:
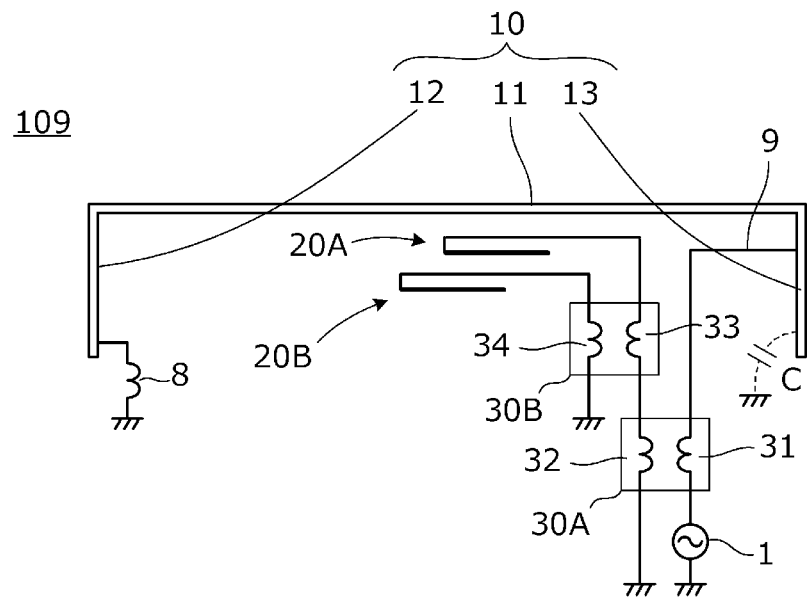
FIG. 25 illustrates a circuit configuration of an antenna device 109 according to a ninth preferred embodiment of the present invention.

FIG. 25 illustrates a circuit configuration of an antenna device 109 according to a ninth preferred embodiment of the present invention. The antenna device 109 includes the first coupling circuit 30A, the second coupling circuit 30B, the first non-radiating resonant circuit 20A, and the second non-radiating resonant circuit 20B. The second coupling circuit 30B includes the third coupling element 33 and the fourth coupling element 34 that are coupled to each other.

The third coupling element 33 is connected between the second coupling element 32 and the first non-radiating resonant circuit 20A. The first non-radiating resonant circuit 20A is connected to the second coupling element 32, and the second non-radiating resonant circuit 20B is connected to the fourth coupling element 34. The remaining configuration is the same as or similar to that of the circuit illustrated in FIG. 4 in the first preferred embodiment.

In the present preferred embodiment, the resonant frequency of the first non-radiating resonant circuit 20A and the resonant frequency of the second non-radiating resonant circuit 20B are equal or substantially equal to each other, and thus, the poles generated in the two non-radiating resonant circuits become deeper, and impedance matching in this frequency band is improved.

Tenth Preferred Embodiment

Figure 26:
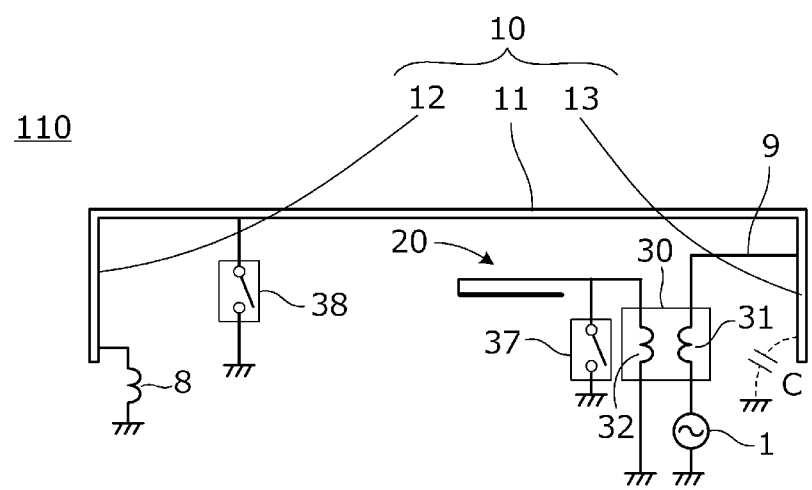
FIG. 26 illustrates a circuit configuration of an antenna device 110 according to a tenth preferred embodiment of the present invention.

FIG. 26 is a circuit diagram of an antenna device 110 according to a tenth preferred embodiment of the present invention. The antenna device 110 includes a switch 37 connected between the non-radiating resonant circuit 20 and the ground. The antenna device 110 also includes a switch 38 connected between the radiating element 10 and the ground. The remaining configuration is the same as or similar to that of the circuit illustrated in FIG. 4 in the first preferred embodiment.

The switches 37 and 38 are switched independently or in association with each other. By changing the frequency of a pole generated by providing the coupling circuit 30 and the non-radiating resonant circuit 20 in accordance with the state of the switch 37, or by changing a matching state, the impedance matching is able to be improved. In addition, by changing the resonant frequency of the non-radiating resonant circuit 20 or by changing the impedance matching state between the coupling circuit 30 and the non-radiating resonant circuit 20 so as to make the non-radiating resonant circuit 20 be coupled easily to the feeder circuit 1 via the coupling circuit 30, the impedance matching is able to be improved.

In addition, in accordance with the state of the switch 38, the frequency of a pole generated by resonance of the radiating element 10 is able to be changed.

Eleventh Preferred Embodiment

Figure 27A:
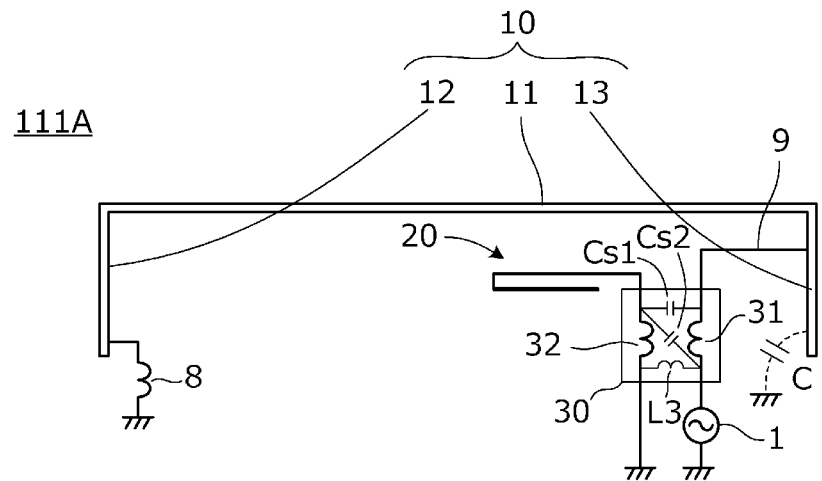
FIGS. 27A and 27B illustrate circuit configurations of antenna devices 111A and 111B according to an eleventh preferred embodiment of the present invention.
Figure 27B:
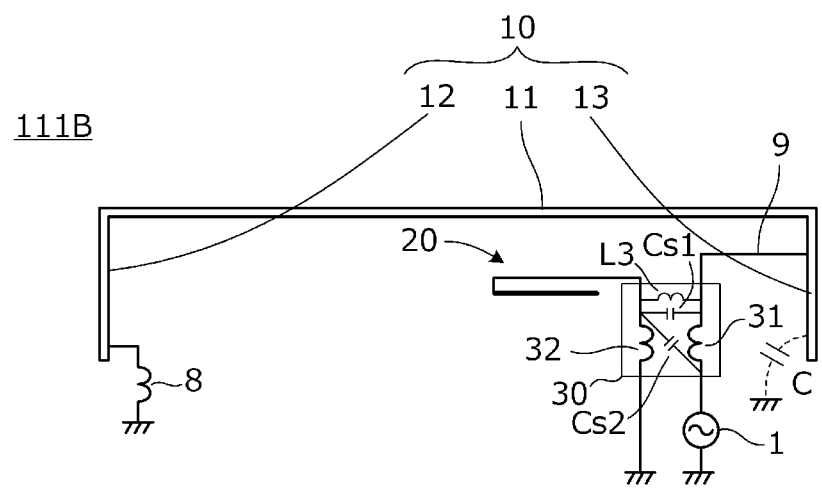

FIGS. 27A and 27B illustrate circuit configurations of antenna devices 111A and 111B according to an eleventh preferred embodiment of the present invention. In the examples in both of FIGS. 27A and 27B, parasitic capacitances represented by capacitors Cs1 and Cs2, for example, are included between the first coupling element 31 and the second coupling element 32 of the coupling circuit 30. In addition, the coupling circuit 30 includes an inductor L3 connected between the first coupling element 31 and the second coupling element 32.

The inductor L3 and the capacitors Cs1 and Cs2 of parasitic capacitances resonate in parallel. Accordingly, a reactance component generated in the coupling circuit 30 is reduced or prevented in the parallel resonant frequency band. Thus, a reactance component that is added by including the coupling circuit 30 is canceled, and a change from a matching state in which the coupling circuit 30 is not provided is able to be reduced or prevented.

Twelfth Preferred Embodiment

Figure 28:
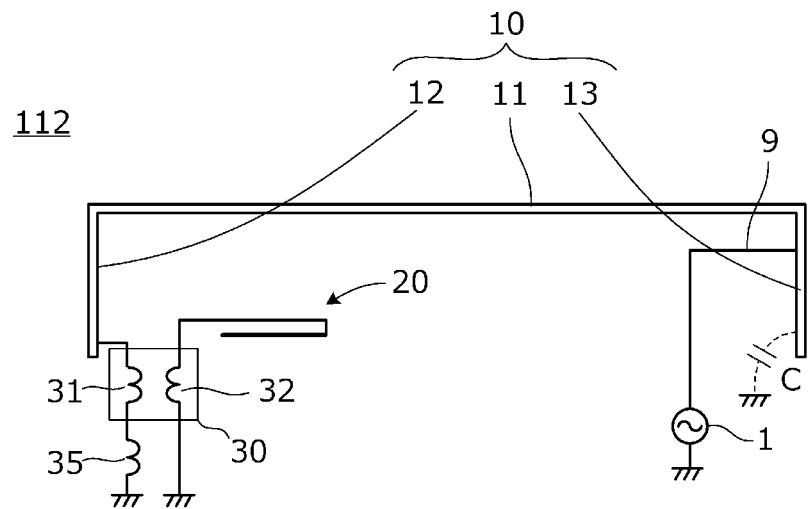
FIG. 28 illustrates a circuit configuration of an antenna device 112 according to a twelfth preferred embodiment of the present invention.

FIG. 28 illustrates a circuit configuration of an antenna device 112 according to a twelfth preferred embodiment of the present invention.

The antenna device 112 according to the present preferred embodiment includes the radiating element 10, the coupling circuit 30, and the non-radiating resonant circuit 20. The feeder circuit 1 is connected to the radiating element 10. The coupling circuit 30 includes the first coupling element 31 that is connected between the radiating element 10 and the ground, and the second coupling element 32 coupled to the first coupling element 31. The non-radiating resonant circuit 20 is connected to the second coupling element 32. Also, the inductor 35 is disposed between the first coupling element 31 and the ground in this example.

With the above configuration, the radiating element 10 and the non-radiating resonant circuit 20 do not interfere with each other regarding radiation, and a radiation characteristic of the radiating element 10 is not adversely affected. In addition, a frequency characteristic of a return loss of the radiating element 10 seen from the feeder circuit 1 is adjusted by a resonance characteristic of the non-radiating resonant circuit 20, and a pole is generated in a desired frequency band to broaden the band of the frequency characteristic of the antenna. Since a current intensity is particularly high in a portion that is connected to the ground, the radiating element 10 and the non-radiating resonant circuit 20 are able to be coupled to each other via the coupling circuit 30. In addition, the coupling circuit 30 and the non-radiating resonant circuit 20 are able to be arranged with a higher degree of freedom.

Thirteenth Preferred Embodiment

Figure 29:
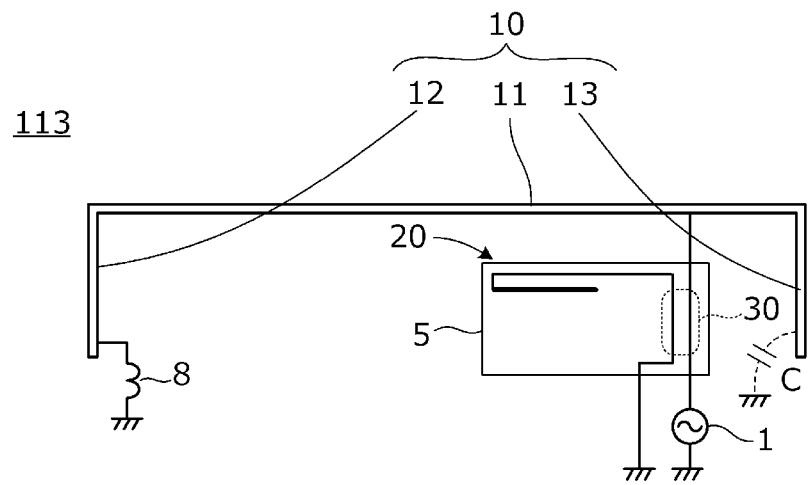
FIG. 29 illustrates a circuit configuration of an antenna device 113 according to a thirteenth preferred embodiment of the present invention.

FIG. 29 illustrates a circuit configuration of an antenna device 113 according to a thirteenth preferred embodiment of the present invention.

The antenna device 113 according to the present preferred embodiment includes a substrate 5 on which the coupling circuit 30 and the non-radiating resonant circuit 20 are each provided using conductor patterns. The remaining configuration is the same as or similar to that of the circuit illustrated in FIG. 4 in the first preferred embodiment.

The substrate 5 is preferably made of, for example, a resin multi-layer substrate or a ceramic multi-layer substrate. In a case of a resin multi-layer substrate, for example, a plurality of thermoplastic resin materials on surfaces of which copper-foil patterns are provided are stacked and pressed with heat. In a case of a ceramic multi-layer substrate, a plurality of ceramic green sheets on surfaces of which conductor-paste patterns are provided are stacked and fired.

Note that in a case in which the coupling circuit 30 and the non-radiating resonant circuit 20 are provided on different substrates, the non-radiating resonant circuit 20 may be provided using the resin multi-layer substrate or the ceramic multi-layer substrate.

According to the present preferred embodiment, since the coupling circuit 30 and the non-radiating resonant circuit 20 are integrated with each other, the area used is reduced.

Fourteenth Preferred Embodiment

A fourteenth preferred embodiment of the present invention will illustrate an antenna device including a PIFA (planar inverted-F antenna) and a parasitic radiating element.

Figure 30:
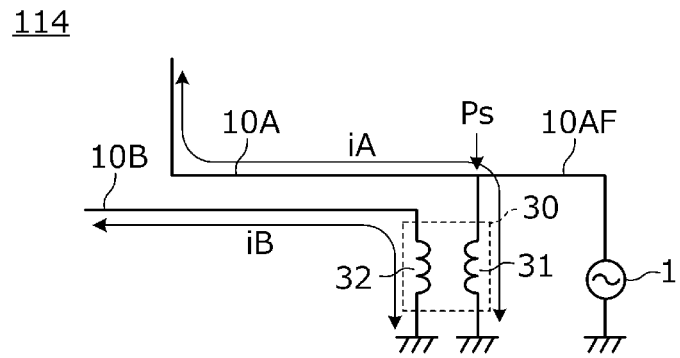
FIG. 30 illustrates a circuit configuration of an antenna device 114 according to a fourteenth preferred embodiment of the present invention.

FIG. 30 illustrates a circuit configuration of an antenna device 114 according to the fourteenth preferred embodiment. The antenna device 114 according to the present preferred embodiment includes a feeding radiating element 10A, a feeding line 10AF, a parasitic radiating element 10B, and the coupling circuit 30. The feeder circuit 1 is connected between the feeding line 10AF and the ground. The configuration and advantageous effects of the coupling circuit 30 are as described in the above-described preferred embodiments.

The first coupling element 31 of the coupling circuit 30 is connected between a connection point Ps between the feeding radiating element 10A and the feeding line AF and the ground. The feeding radiating element 10A, the feeding line 10AF, and the first coupling element 31 define a PIFA. That is, the first coupling element 31 of the coupling circuit 30 is provided at a portion of a short pin of the PIFA. The short pin connects the connection point Ps and the ground to each other. A capacitor or an inductor may be provided in this portion.

The parasitic radiating element 10B is preferably a monopole parasitic radiating element, for example. The second coupling element 32 of the coupling circuit 30 is disposed in the vicinity of a ground end of the parasitic radiating element 10B.

A resonant current iA of the feeding radiating element flows between an open end of the feeding radiating element 10A and a ground end of the first coupling element 31. In addition, a resonant current iB flows between an open end of the parasitic radiating element 10B and a ground end of the second coupling element 32. A phase of the current iA flowing in the feeding radiating element 10A and a phase of the current iB flowing in the parasitic radiating element 10B are different from each other.

In general, if the phase of resonance of the feeding radiating element and the phase of resonance of the parasitic radiating element are the same, a notch is present between the two resonant frequencies in a frequency characteristic of the antenna device. Therefore, the band cannot be broadened even if the parasitic radiating element is provided. That is, the parasitic radiating element cannot be provided adjacent to the feeding radiating element in order to broaden the band.

In contrast, in the present preferred embodiment, the current flowing in the first coupling element 31 of the coupling circuit 30 and the current flowing in the second coupling element 32 have a phase difference. Therefore, the phase of resonance of the feeding radiating element 10A and the phase of resonance of the parasitic radiating element 10B are not the same, and thus, a notch is not present between the two resonant frequencies. The phase difference between the first coupling element 31 and the second coupling element 32 is preferably, for example about 180° at most, and a phase difference of less than or equal to about 180° is generated by a parasitic component. That is, due to an effect of the parasitic capacitance between the first coupling element 31 and the second coupling element 32, the phase difference between the current flowing in the first coupling element 31 and the current flowing in the second coupling element 32 is preferably greater than about 0° and less than about 180°, for example.

As illustrated in FIG. 30, since the resonant current iA flows between the open end and the short position in the PIFA, the phase of current flowing in the feeder circuit 1 and the phase of the resonant current iA are different from each other. Accordingly, if the first coupling element 31 of the coupling circuit 30 is disposed in the feeding line 10AF and the parasitic radiating element 10B is connected to the second coupling element 32, since there is no correlation between the phase of the current iB flowing in the parasitic radiating element 10B and the phase of the current iA flowing in the feeding radiating element 10A, as described above, the resonance of the feeding radiating element 10A and the resonance of the parasitic radiating element 10B may have the same phase, in which case, the above notch is present. In the present preferred embodiment, such a problem does not arise, and the parasitic radiating element 10B and the feeding radiating element 10A are able to be provided adjacent to each other.

Although the present preferred embodiment is an example in which the feeding radiating element is a PIFA, the feeding radiating element is not limited to a PIFA and may be a typical inverse-F antenna. The same or substantially the same advantageous effects are able to be obtained.

Fifteenth Preferred Embodiment

A fifteenth preferred embodiment of the present invention will illustrate an example of an antenna device including a plurality of parasitic radiating elements.

Figure 31A:
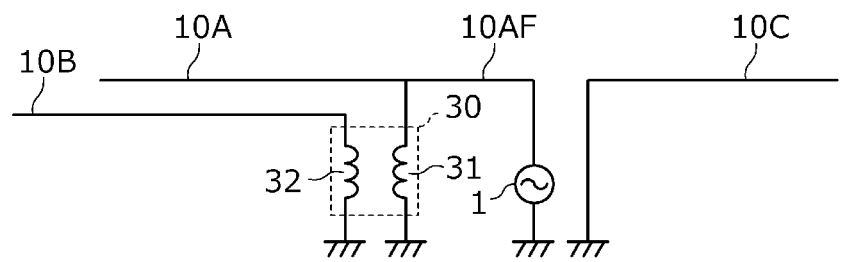
FIG. 31A illustrates a circuit configuration of an antenna device 115 according to a fifteenth preferred embodiment of the present invention.

FIG. 31A illustrates a circuit configuration of an antenna device 115 according to the fifteenth preferred embodiment. The antenna device 115 according to the present preferred embodiment includes the feeding radiating element 10A, the feeding line 10AF, the parasitic radiating element 10B, a parasitic radiating element 10C, and the coupling circuit 30. The feeder circuit 1 is connected between the feeding line 10AF and the ground.

The parasitic radiating element 10C is, at around a ground end thereof, mainly coupled to the feeding line 10AF of the feeding radiating element 10A. The remaining configuration is the same as or similar to that of the antenna device 114 illustrated in FIG. 30.

Figure 31B:
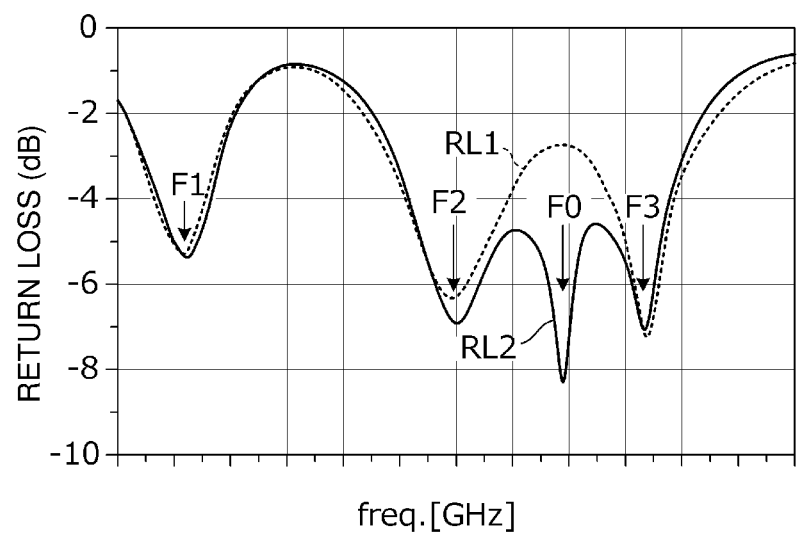
FIG. 31B illustrates a frequency characteristic of a return loss of the antenna device 115 illustrated in FIG. 31A and an antenna device according to a comparative example.

FIG. 31B illustrates a frequency characteristic of a return loss of the antenna device 115 illustrated in FIG. 31A and an antenna device according to a comparative example. In FIG. 31B, a return loss characteristic RL1 is a return loss of the antenna device 115 according to the present preferred embodiment, and a return loss characteristic RL2 is a return loss of the antenna device according to the comparative example. The antenna device according to the comparative example is an antenna device in which the coupling circuit 30 and the parasitic radiating element 10B are not included and the first coupling element 31 merely defines and functions as a short pin of a PIFA. In either antenna device, a pole is generated at a center frequency F1 of a low band. This is due to ¼ wavelength resonance of the feeding radiating element 10A. Another pole is generated at a frequency F2. This is due to ¾ wavelength resonance of the feeding radiating element 10A. A still another pole is generated at a frequency F3. This is due to ¼ wavelength resonance of the monopole parasitic radiating element 10C.

In the antenna device 115 according to the present preferred embodiment, a pole is also generated at a frequency F0. This is due to a resonance characteristic of the parasitic radiating element 10B. In this manner, it is possible to provide an antenna device including the parasitic radiating element 10B that is connected to the coupling circuit 30 and the parasitic radiating element 10C that does not interpose coupling of the coupling circuit 30.

Also in the present preferred embodiment, the feeding radiating element is not limited to a PIFA and may be a typical inverse-F antenna. The same or substantially the same advantageous effects are obtained.

Sixteenth Preferred Embodiment

A sixteenth preferred embodiment of the present invention will illustrate an example of an antenna device including a plurality of parasitic radiating elements.

Figure 32:
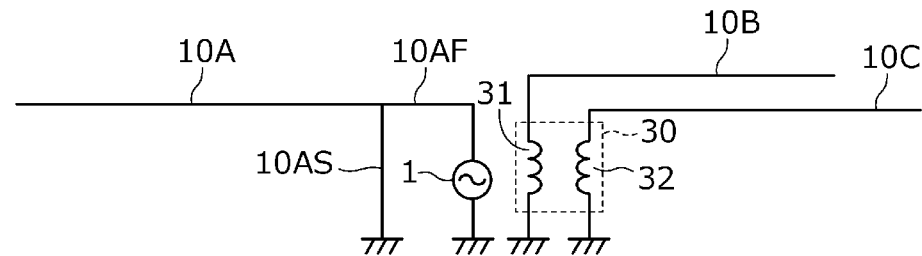
FIG. 32 illustrates a circuit configuration of an antenna device 116 according to a sixteenth preferred embodiment of the present invention.

FIG. 32 illustrates a circuit configuration of an antenna device 116 according to the sixteenth preferred embodiment. The antenna device 116 according to the present preferred embodiment includes the feeding radiating element 10A, the feeding line 10AF, a short pin 10AS, the parasitic radiating elements 10B and 10C, and the coupling circuit 30. The feeding radiating element 10A is a radiating element of a PIFA.

In the present preferred embodiment, the first coupling element 31 of the coupling circuit 30 is disposed around the ground end of the parasitic radiating element 10B, and the second coupling element 32 of the coupling circuit 30 is disposed around the ground end of the parasitic radiating element 10C. The parasitic radiating element 10B is, at around the ground end thereof, mainly coupled to the feeding line 10AF of the feeding radiating element 10A.

As in the present preferred embodiment, the two parasitic radiating elements 10B and 10C may be configured to be coupled to each other via the coupling circuit 30.

Note that in the present preferred embodiment, the feeding radiating element is not limited to a PIFA or an inverted-F antenna, and may be, for example, a monopole radiating element. That is, any feeding radiating element that is coupled to the parasitic radiating element 10B may be used, and the same or substantially the same advantageous effects are obtained.

Seventeenth Preferred Embodiment

Figure 33:
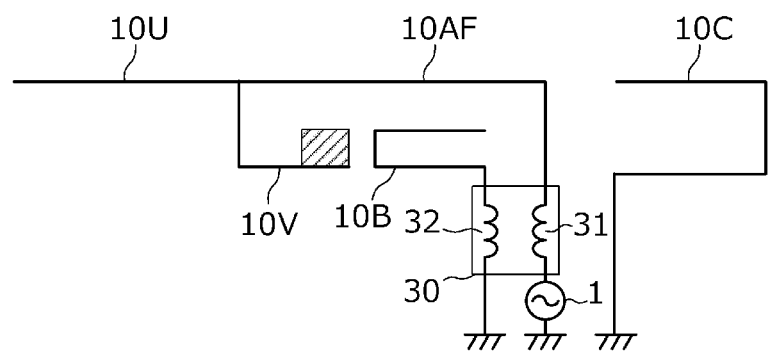
FIG. 33 illustrates a circuit configuration of an antenna device 117 according to a seventeenth preferred embodiment of the present invention.

FIG. 33 illustrates a circuit configuration of an antenna device 117 according to a seventeenth preferred embodiment of the present invention. The antenna device 117 according to the present preferred embodiment includes feeding radiating elements 10U and 10V, the feeding line 10AF, the parasitic radiating element 10B, the parasitic radiating element 10C, and the coupling circuit 30. The feeder circuit 1 is connected between the feeding line 10AF and the ground. The configuration and advantageous effects of the coupling circuit 30 are as described in the above preferred embodiments.

The feeding radiating elements 10U and 10V and the feeding line 10AF define a branch-feeding monopole antenna or a branch-feeding PIFA. The parasitic radiating element 10C is mainly coupled with the feeding line 10AF to define and function as a monopole or an inverted-L antenna.

Figure 34:
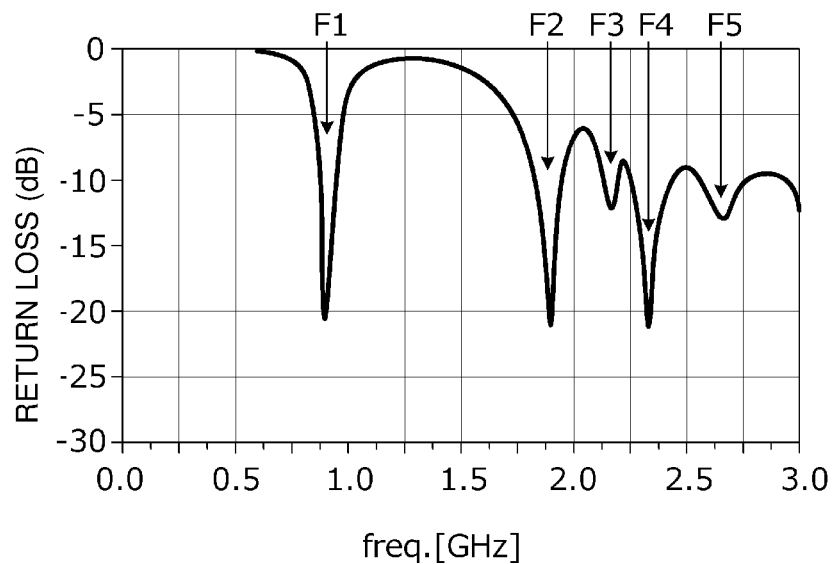
FIG. 34 illustrates a frequency characteristic of a return loss of the antenna device 117.

FIG. 34 illustrates a frequency characteristic of a return loss of the antenna device 117. In FIG. 34, a pole indicated by a frequency F1 is mainly due to a fundamental wave generated in the feeding radiating element 10U and the feeding line 10AF in a branch antenna defined by the feeding radiating elements 10U and 10V and the feeding line 10AF. A pole indicated by a frequency F2 is due to a fundamental wave generated in the parasitic radiating element 10C. A pole indicated by a frequency F3 is mainly caused by, for example, a ¾ wavelength harmonic generated in the feeding radiating element 10U and the feeding line 10AF. A pole indicated by a frequency F4 is due to a fundamental wave generated in the parasitic radiating element 10B. A pole indicated by a frequency F5 is mainly due to resonance generated in the feeding radiating element 10V in the branch antenna defined by the feeding radiating elements 10U and 10V and the feeding line 10AF.

Note that a parasitic capacitance is actively generated between the feeding radiating element 10V and the parasitic radiating element 10B so that a phase difference of the resonant current between the feeding radiating element 10V and the parasitic radiating element 10B is about 90°. Thus, a pole of the feeding radiating element 10V indicated by the frequency F4 and a pole of the parasitic radiating element 10B indicated by the frequency F5 are generated.

In the antenna device according to the present preferred embodiment, by including the branch antenna including the feeding radiating element 10V, a communication band that is broadened to about 2700 MHz, for example, is able to be covered, and a broad-band antenna that covers a low band of about 700 MHz to about 900 MHz and a high band of about 1700 MHz to about 2700 MHz, for example, is able to be provided.

Eighteenth Preferred Embodiment

Figure 35:
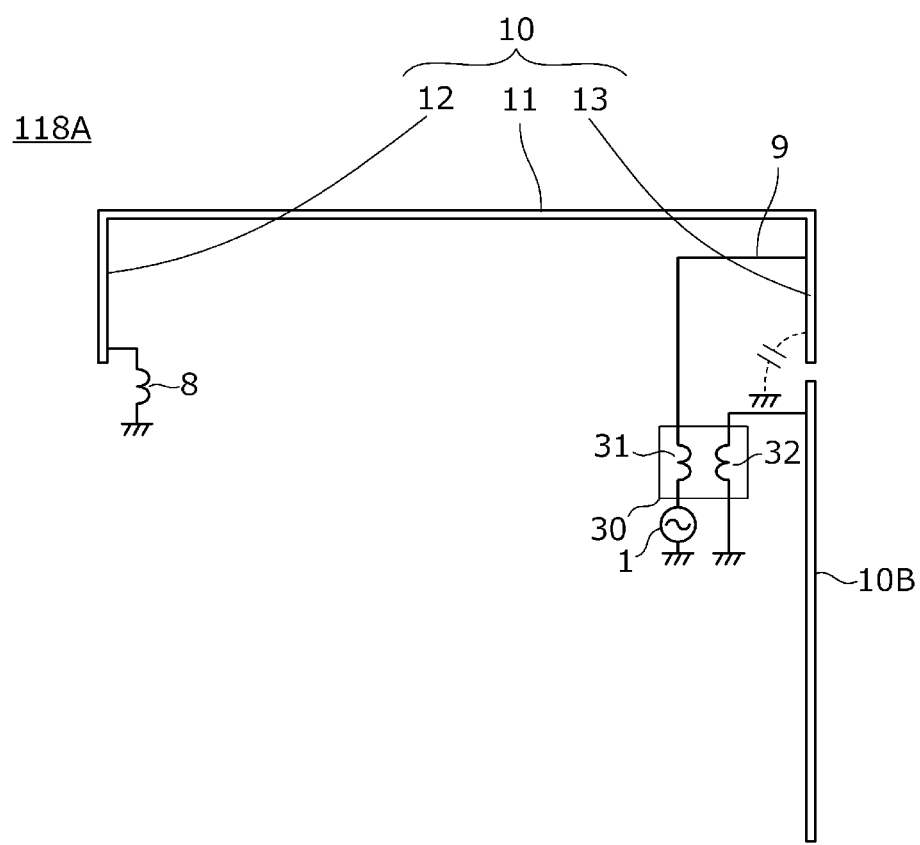
FIG. 35 is a circuit diagram of an antenna device 118A according to an eighteenth preferred embodiment of the present invention.

FIG. 35 is a circuit diagram of an antenna device 118A according to an eighteenth preferred embodiment of the present invention. In the antenna device 118A, the parasitic radiating element 10B is provided at a side surface portion of the metal housing. The second coupling element 32 of the coupling circuit is connected to the parasitic radiating element 10B. The remaining configuration is the same as or similar to that of the circuit illustrated in FIG. 4 in the first preferred embodiment.

With the structure of the antenna device 118A, the parasitic radiating element 10B is separated from the radiating element 10, and a good radiation characteristic is able to be obtained at a resonant frequency that is added by the coupling circuit 30 and the parasitic radiating element 10B. Furthermore, the radiation characteristic of the radiating element 10 is not degraded at frequencies other than the resonant frequency.

Figure 36:
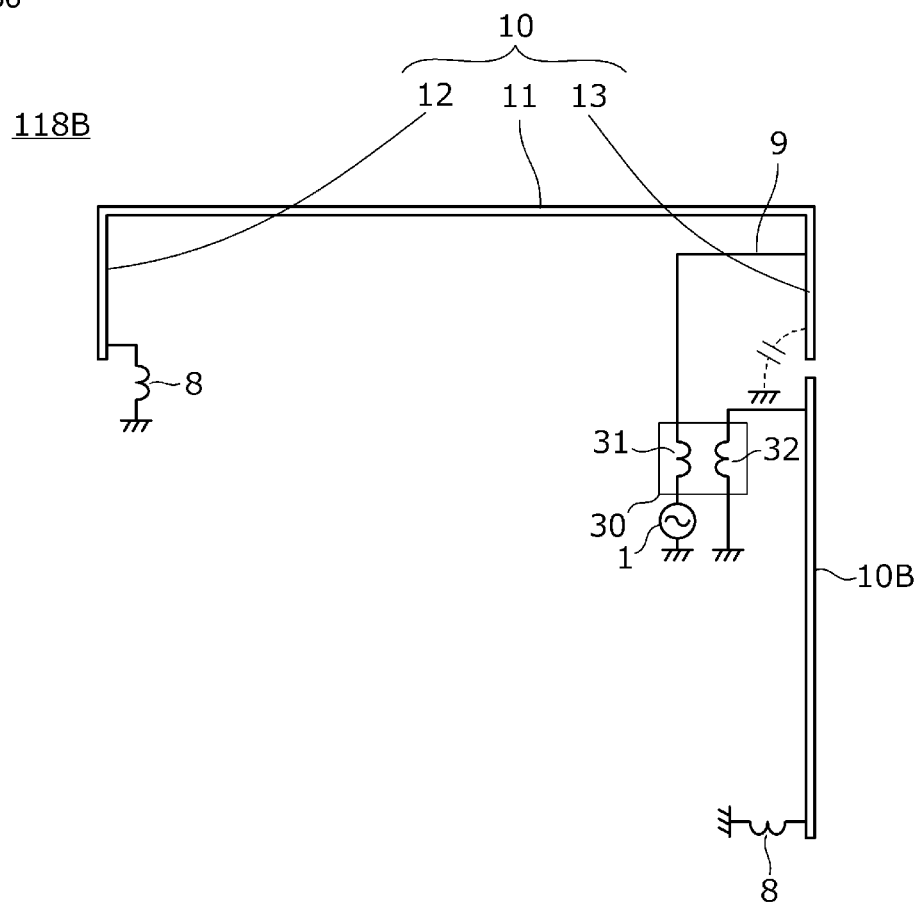
FIG. 36 is a circuit diagram of another antenna device 118B according to the eighteenth preferred embodiment of the present invention.

FIG. 36 is a circuit diagram of another antenna device 118B according to the eighteenth preferred embodiment. In the antenna device 118B, the parasitic radiating element 10B is provided at a side surface portion of the metal housing. An end portion of the parasitic radiating element 10B is connected to the ground (is grounded) of a circuit substrate, for example, via the inductor 8. The parasitic radiating element 10B defines and functions as a ½ wavelength resonant antenna.

With the structure of the antenna device 118B, since the tip of the side surface portion of the metal housing is grounded, variations in antenna characteristic due to a change of surrounding environment is able to be reduced or prevented. Even in a case in which a side surface portion of another metal housing that is grounded via a slit is present forward of the tip of the side surface portion of the metal housing, since the tip of the side surface portion of the metal housing is grounded, a field maximum point moves from the tip of the parasitic radiating element 10B toward a center, and a good radiation characteristic is able to be obtained at a resonant frequency that is added by the coupling circuit 30. Furthermore, the resonant frequency is able to be easily adjusted by the inductance of the inductor 8.

Figure 37:
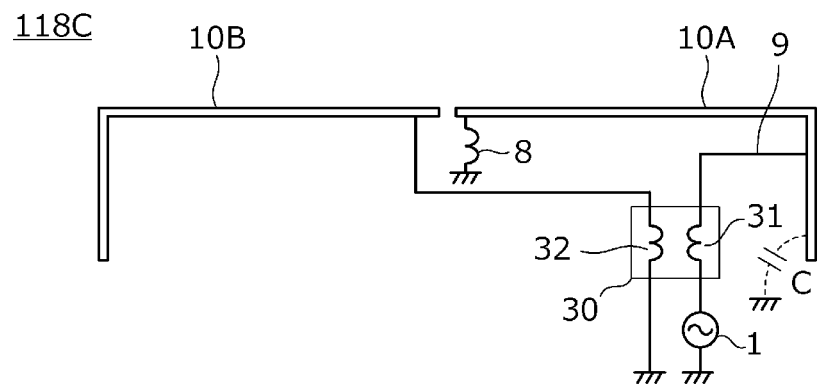
FIG. 37 is a circuit diagram of still another antenna device 118C according to the eighteenth preferred embodiment of the present invention.

FIG. 37 is a circuit diagram of another antenna device 118C according to the eighteenth preferred embodiment. In the antenna device 118C, the feeding radiating element 10A extends from an end surface portion of the metal housing to a side surface portion thereof. Similarly, the parasitic radiating element 10B is extends from an end surface portion of the metal housing to a side surface portion thereof. In this manner, the main portion of the parasitic radiating element 10B is provided at the end surface portion of the metal housing. In addition, the parasitic radiating element 10B may be close to a ground end of the feeding radiating element 10A. With this structure, since a field maximum point of the feeding radiating element 10A moves from the ground end toward a center, unnecessary interference between the feeding radiating element 10A and the parasitic radiating element 10B is able to be reduced or prevented.

Nineteenth Preferred Embodiment

Figure 38:
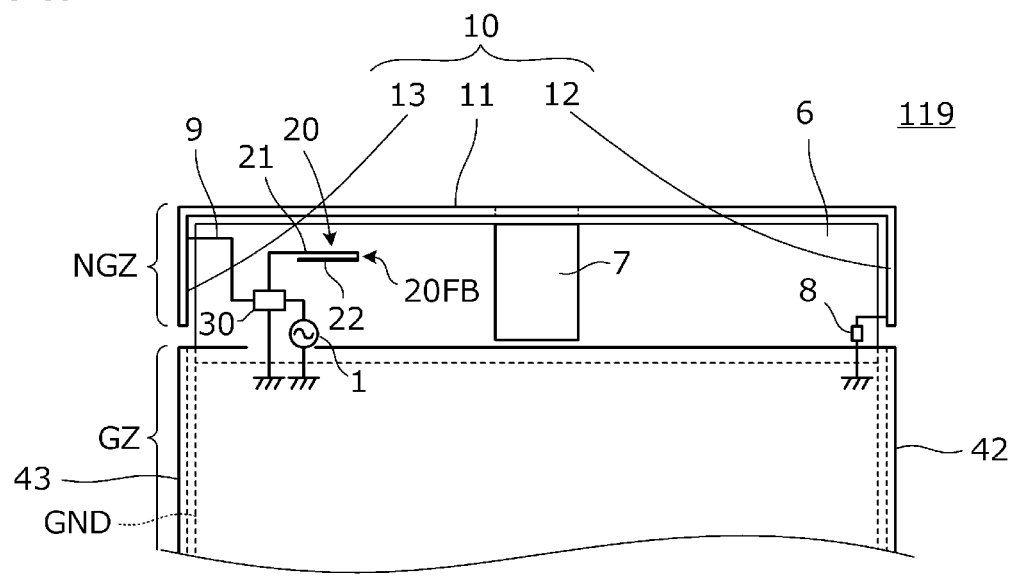
FIG. 38 is a plan view of a main portion of an antenna device 119 according to a nineteenth preferred embodiment of the present invention.

FIG. 38 is a plan view of a main portion of an antenna device 119 according to a nineteenth preferred embodiment of the present invention.

A metal housing of electronic equipment includes the radiating element 10, defined by an end portion of the metal housing. A connection position of the feeding line 9 for the radiating element 10 and a position of the non-radiating resonant circuit 20 differ from those in the antenna device 101 illustrated in FIG. 2 in the first preferred embodiment.

In the present preferred embodiment, in a plan view of the circuit substrate 6, the feeding line 9 is connected to the left side surface portion 13 of the radiating element 10.

Accordingly, the non-radiating resonant circuit 20 is disposed on the right side of the coupling circuit 30. This positional relationship is an alternative configuration (symmetric relationship) to the example illustrated in FIG. 2. The remaining configuration is the same as or similar to that illustrated in the first preferred embodiment.

Figure 39:
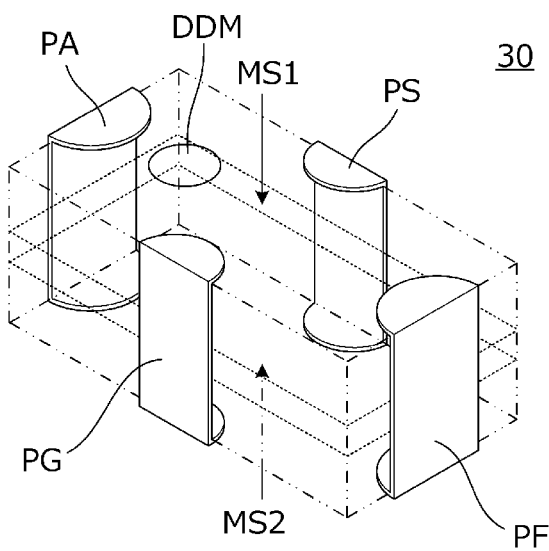
FIG. 39 is a perspective view of the coupling circuit 30 according to the nineteenth preferred embodiment of the present invention.

FIG. 39 is a perspective view of the coupling circuit 30 according to the present preferred embodiment. The external configuration of the coupling circuit 30 is represented by a two-dotted-and-dashed line. On an outer surface of the coupling circuit 30, the feeder circuit connection terminal PF, the radiating element connection terminal PA, the ground terminal PG, and the non-radiating resonant circuit connection terminal PS are formed. The coupling circuit 30 is the same or substantially the same as the coupling circuit 30 illustrated in FIG. 1 in the first preferred embodiment. However, the second surface MS2 is the mount surface that faces the circuit substrate. On a top surface (first surface) that is opposed to the mount surface (second surface) MS2, the direction discrimination mark DDM is provided. Thus, the position of the terminals differ from that in the coupling circuit 30 illustrated in FIG. 1 in a plan view. In the coupling circuit 30 illustrated in FIG. 1, in a plan view, the ground terminal PG, the feeder circuit connection terminal PF, and the non-radiating resonant circuit connection terminal PS are disposed clockwise in this order from the radiating element connection terminal PA. In the nineteenth preferred embodiment, as illustrated in FIG. 39, the ground terminal PG, the feeder circuit connection terminal PF, and the non-radiating resonant circuit connection terminal PS are disposed counterclockwise in this order from the radiating element connection terminal PA.

As described above, since the first end and the second end of the first coupling element and the first end and the second end of the second coupling element are provided on both the first surface MS1 and the second surface MS2, either the first surface or the second surface may define and function as the mount surface. Accordingly, either the first surface MS1 or the second surface MS2 of the coupling circuit 30 may be selected as the mount surface to be mounted on a circuit substrate such that the terminals are disposed at positions appropriate for the position of a circuit or an element to which the first coupling element and the second coupling element provided on the coupling circuit 30 are connected.

The examples illustrated in FIG. 8 and FIG. 39 illustrate examples in which interlayer connection conductors that connect the four terminals provided on the first surface MS1 and the four terminals provided on the second surface MS2 to each other are provided on end surfaces of the multi-layer body. However, a plurality of via conductors may be provided inside the multi-layer body, and the four terminals provided on the first surface MS1 and the four terminals provided on the second surface MS2 may be connected to each other via these via conductors.

In addition to formation of the above via conductors, LGA (Land Grid Array) terminals, for example, may preferably be provided on the mount surface of the coupling circuit 30.

Figure 40:
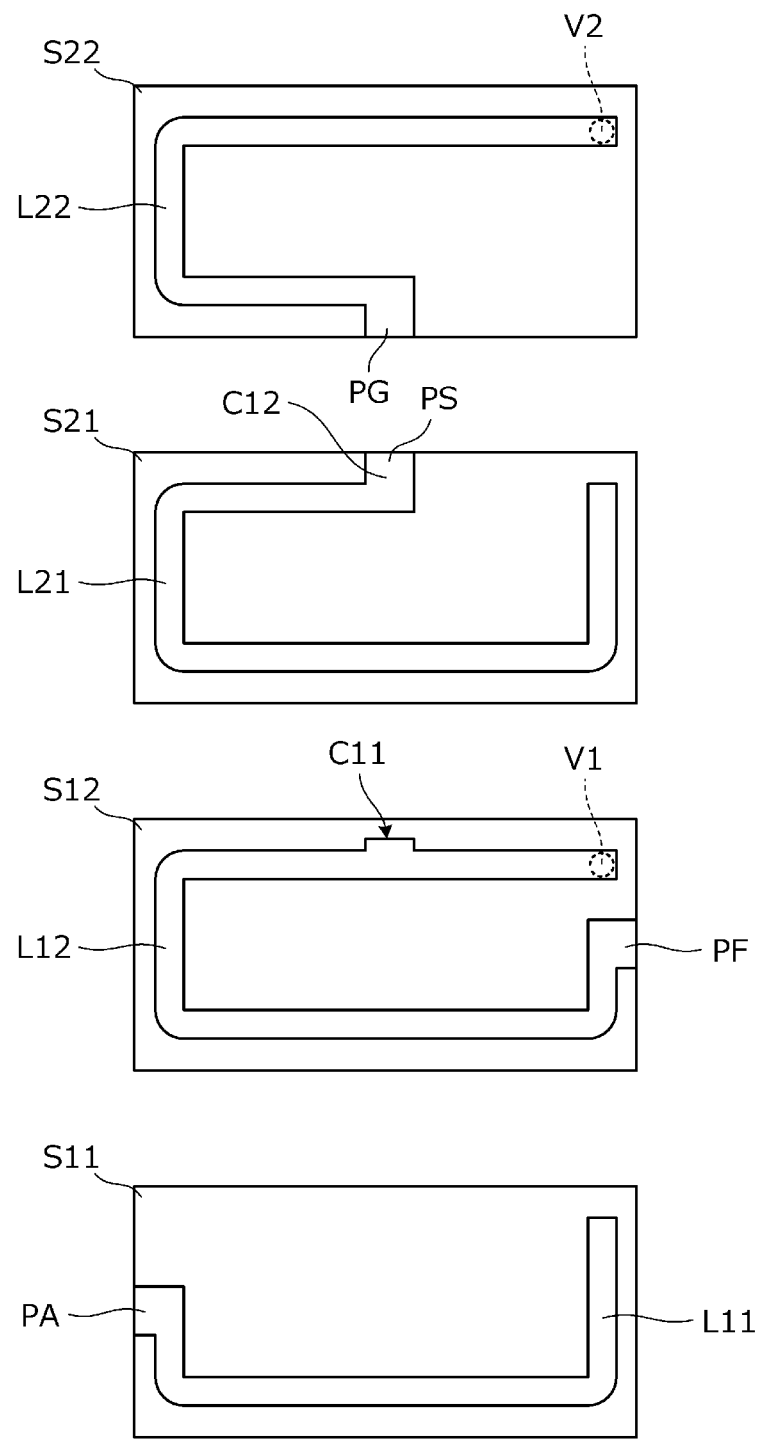
FIG. 40 illustrates a configuration of another coupling circuit 30 according to the nineteenth preferred embodiment of the present invention and is an exploded plan view illustrating conductor patterns provided on layers of the coupling circuit 30.

FIG. 40 illustrates a configuration of another coupling circuit 30 according to the present preferred embodiment and is an exploded plan view illustrating conductor patterns provided on layers of the coupling circuit 30.

As illustrated in FIG. 40, the first conductor pattern L11, the second conductor pattern L12, the third conductor pattern L21, and the fourth conductor pattern L22 are respectively provided on the insulating material S11, the insulating material S12, the insulating material S21, and the insulating material S22. The insulating materials S11, S12, S21, and S22 are stacked such that these coil conductor patterns are disposed in the following order from a layer close to the mount surface: the first conductor pattern L11, the second conductor pattern L12, the third conductor pattern L21, and the fourth conductor pattern L22.

A first end of the first conductor pattern L11 is connected to the radiating element connection terminal PA, and a second end thereof is connected to a first end of the second conductor pattern L12 via the interlayer connection conductor V1. A second end of the second conductor pattern L12 is connected to the feeder circuit connection terminal PF. A first end of the third conductor pattern L21 is connected to the non-radiating resonant circuit connection terminal PS, and a second end of the third conductor pattern L21 is connected to a first end of the fourth conductor pattern L22 via the interlayer connection conductor V2. A second end of the fourth conductor pattern L22 is connected to the ground terminal PG.

The conductor patterns on the layers illustrated in FIG. 40 are preferably in a symmetric or substantially symmetrical relationship with the conductor patterns illustrated in FIG. 9. Thus, in the coupling circuit including these conductor patterns, in a plan view, the ground terminal PG, the feeder circuit connection terminal PF, and the non-radiating resonant circuit connection terminal PS are disposed counterclockwise in this order from the radiating element connection terminal PA.

As in this example, the terminals may be disposed at positions appropriate for the position of a circuit or an element to which the first coupling element and the second coupling element provided in the coupling circuit 30 are connected.

Twentieth Preferred Embodiment

A twentieth preferred embodiment of the present invention will illustrate an antenna device further including a phase shifter.

Figure 41:
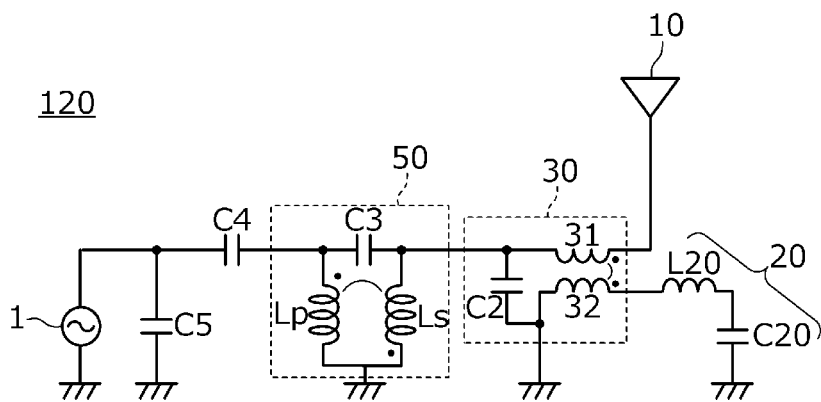
FIG. 41 is a circuit diagram of an antenna device 120 according to a twentieth preferred embodiment of the present invention in which a feeder circuit 1 is connected.

FIG. 41 is a circuit diagram of an antenna device 120 according to the twentieth preferred embodiment in which the feeder circuit 1 is connected. In the antenna device 120, a phase shifter 50 is connected between the feeder circuit 1 and the first coupling element 31 of the coupling circuit 30. The phase shifter 50 is a phase shifter by which a phase shift amount changes depending on the frequency (has frequency dependency). The phase shifter 50 includes a first coil Lp, a second coil Ls, and a capacitor C3 that are coupled to one another.

Note that in this example, capacitors C4 and C5 that provide impedance matching are connected between the feeder circuit 1 and the phase shifter 50.

The configuration of the coupling circuit 30, the radiating element 10, and the non-radiating resonant circuit 20 is the same as or similar to that illustrated in the first preferred embodiment.

Figure 42:
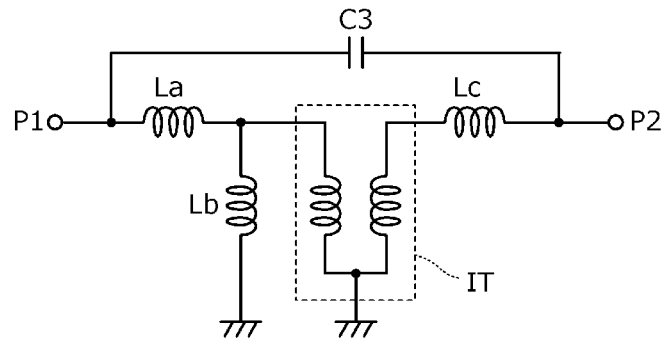
FIG. 42 is an equivalent circuit diagram illustrating a phase shifter 50 according to the twentieth preferred embodiment of the present invention in which an ideal transformer IT and parasitic inductance components are separately illustrated.

FIG. 42 is an equivalent circuit diagram illustrating the phase shifter 50 in which an ideal transformer IT and parasitic inductance components (series parasitic inductance components La and Lc and parallel parasitic inductance component Lb) are separately illustrated.

The coupling coefficient between the first coil Lp and the second coil Ls illustrated in FIG. 41 is lower than that of a common high-frequency transformer, and accordingly, the series parasitic inductance component Lc is large. However, since the capacitance of the capacitor C3 is also large, impedance matching is ensured. In addition, since the capacitance of the capacitor C3 is large, a ratio of a high-band signal bypassing the capacitor C3 is higher than that bypassing the transformer defined by the first coil Lp and the second coil Ls, and a phase shifting effect of the transformer is small. On the other hand, for a low band, the amount bypassing the capacitor C3 is relatively small, and the phase shifting effect of the transformer is large. Thus, the coupling coefficient is preferably determined such that the phase shift amount with respect to a low-band signal is about 180° and the phase shift amount with respect to a high-band signal is about 90°, for example.

Figure 43:
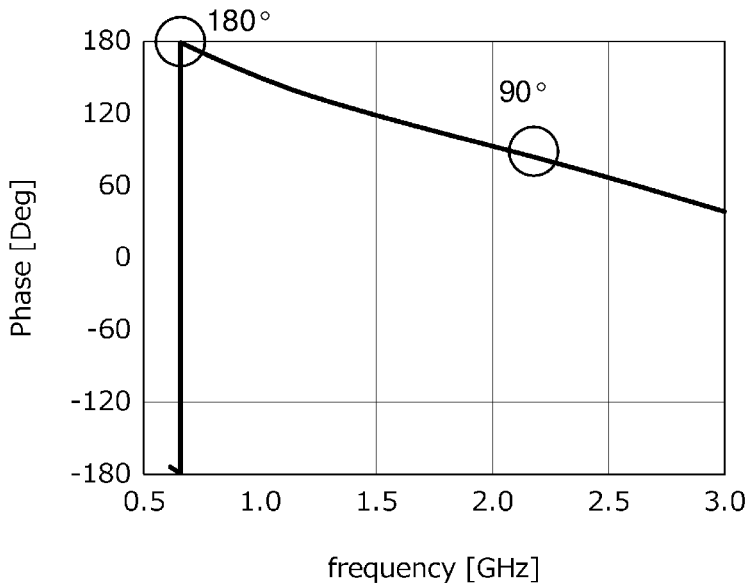
FIG. 43 illustrates a frequency characteristic of a phase shift amount of the phase shifter 50.

FIG. 43 illustrates a frequency characteristic of the phase shift amount of the phase shifter 50. In this example, for example, the phase shift amount in a low band (about 700 MHz to about 900 MHz band, for example) is preferably about 180°, and the phase shift amount in a high band (about 1.7 GHz to about 2.7 GHz band, for example) is preferably about 90°.

Figure 44A:
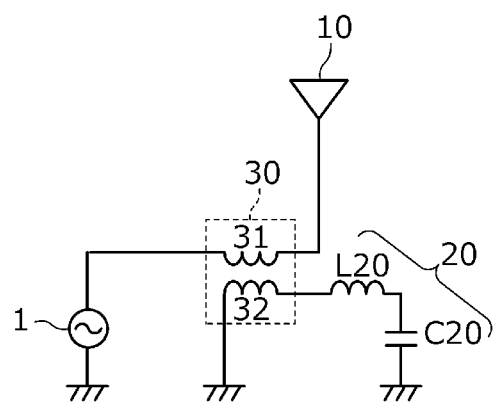
FIG. 44A is a circuit diagram of the antenna device illustrated in the first preferred embodiment of the present invention, which does not include the phase shifter 50.

Next, effects obtained by providing the phase shifter 50 together with the coupling circuit 30 will be described. FIG. 44A is a circuit diagram of the antenna device illustrated in the first preferred embodiment, which does not include the phase shifter 50, and FIG. 44B illustrates impedance loci representing, on a Smith chart, impedances when seeing the antenna device from the feeder circuit 1.

Figure 45A:
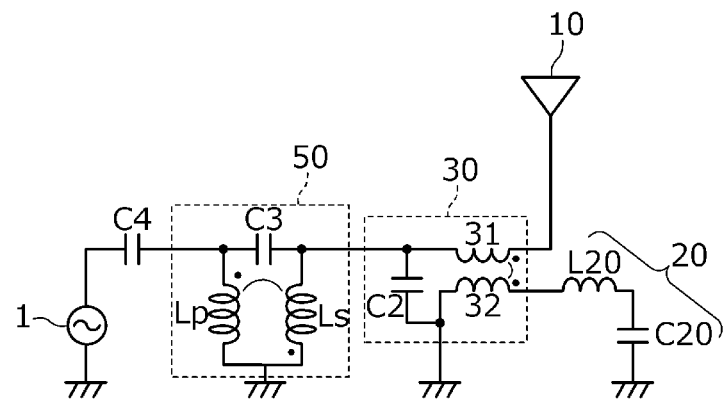
FIG. 45A is a circuit diagram of an antenna device to which the phase shifter 50 is added.
Figure 45B:
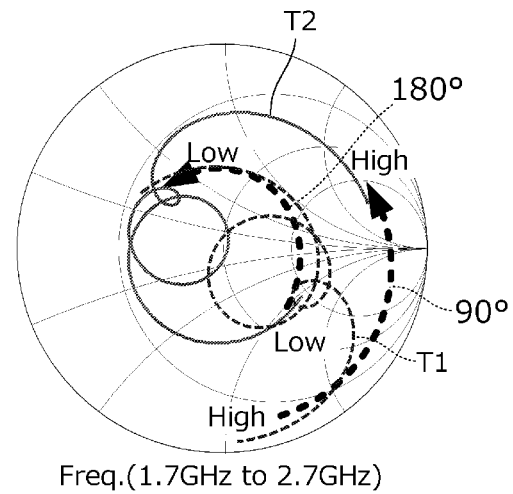
FIG. 45B illustrates impedance loci representing, on a Smith chart, impedances when seeing the antenna device from the feeder circuit 1.

FIG. 45A is a circuit diagram of an antenna device to which the phase shifter 50 is included, and FIG. 45B illustrates impedance loci representing, on a Smith chart, impedances when seeing the antenna device from the feeder circuit 1. This antenna device is a circuit that does not include the capacitor C5 in the circuit illustrated in FIG. 41.

Figure 46A:
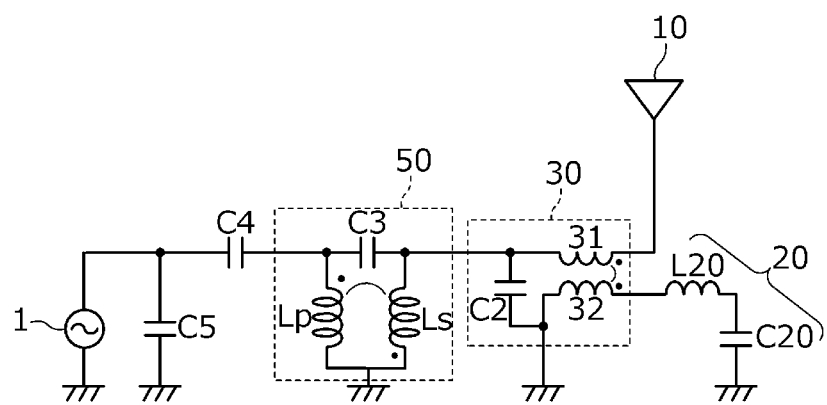
FIG. 46A is a circuit diagram of an antenna device including an impedance matching capacitor C5.
Figure 46B:
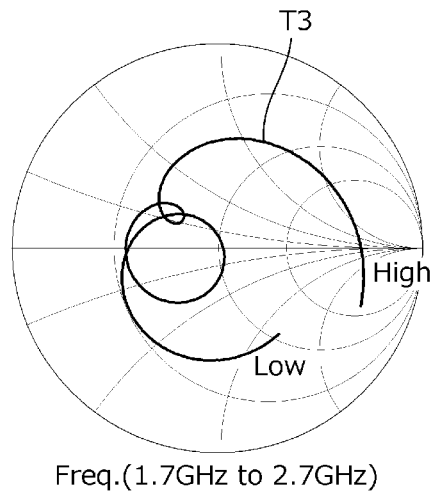
FIG. 46B illustrates an impedance locus representing, on a Smith chart, an impedance when seeing the antenna device from the feeder circuit 1.

FIG. 46A is a circuit diagram of an antenna device including the impedance matching capacitor C5 (the same as or similar to that illustrated in FIG. 41), and FIG. 46B illustrates an impedance locus representing, on a Smith chart, an impedance when seeing the antenna device from the feeder circuit 1.

Figure 44B:
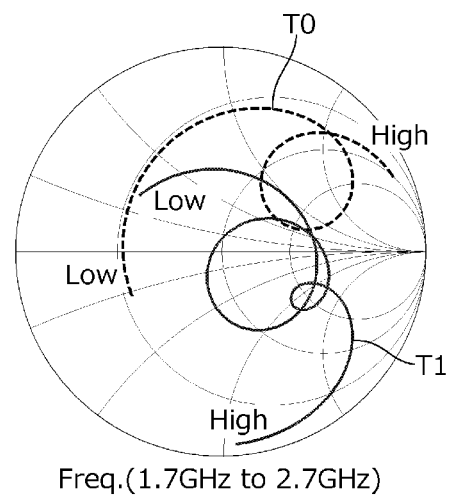
FIG. 44B illustrates impedance loci representing, on a Smith chart, impedances when seeing the antenna device from the feeder circuit 1.

In FIG. 44B, locus T0 is an impedance locus of an antenna device according to a comparative example in which the coupling circuit 30 and the non-radiating resonant circuit 20 are not provided, and locus T1 is an impedance locus of the antenna device illustrated in FIG. 44A. Both are results obtained by a sweep from about 1.7 GHz to about 2.7 GHz. As is clear from FIG. 44B, by including the coupling circuit 30 and the non-radiating resonant circuit 20, as described above, a pole (small loop on chart) is generated in the frequency characteristic of the antenna, and accordingly, the resonant frequency band moves toward the center of the chart. Note that a higher frequency band is present in a periphery of the chart, and it is discovered that matching is difficult in the high frequency band.

In FIG. 45B, locus T2 is an impedance locus of the antenna device including the phase shifter 50, the coupling circuit 30, and the non-radiating resonant circuit 20, and locus T1 is the same as or similar to locus T1 illustrated in FIG. 44A. Both are results obtained by a sweep from about 1.7 GHz to about 2.7 GHz. As is clear from FIG. 45B, by including the phase shifter 50, the phase advances by about 180° in a low band, and the phase advances by about 90° in a high band. Accordingly, the high-frequency band also moves toward the center of the chart.

In FIG. 46B, locus T3 is an impedance locus of the antenna device illustrated in FIG. 46A, and is a result obtained by a sweep from about 1.7 GHz to about 2.7 GHz. As is clear from comparison with locus T2 illustrated in FIG.

45B, by a function of the capacitor C5 that is shunt-connected, the high-frequency band rotates clockwise. Thus, matching is improved in all frequency bands.

Figure 47:
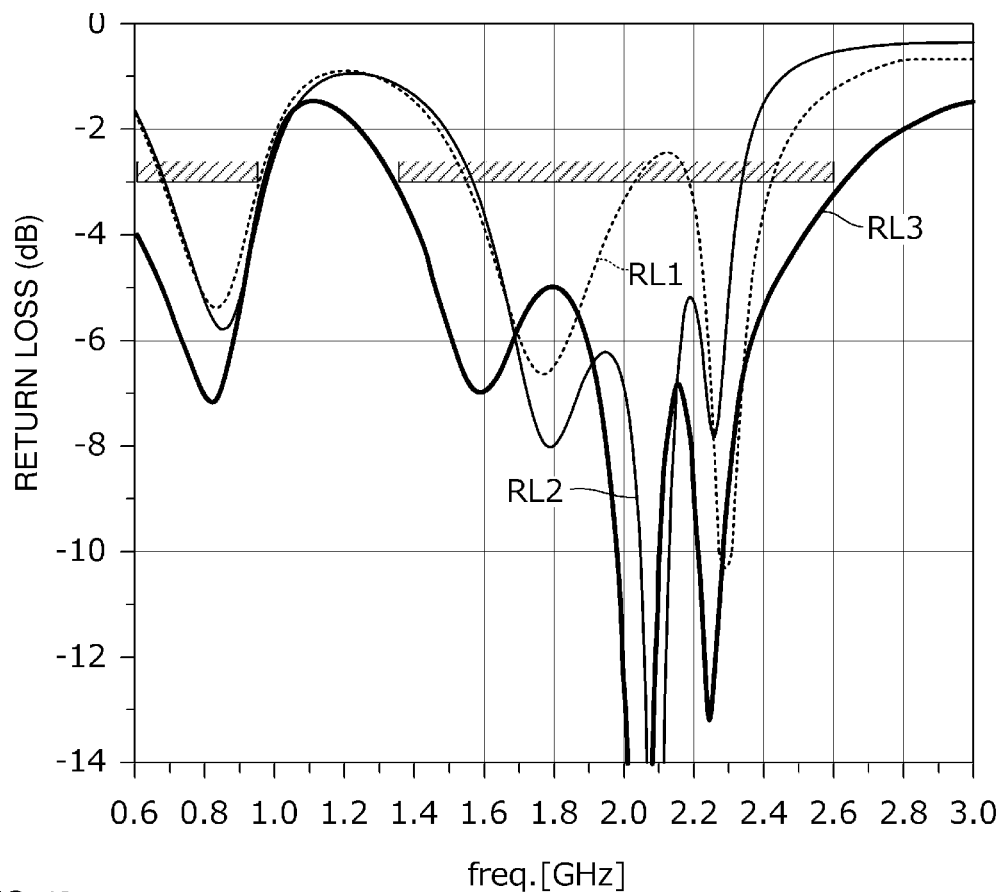
FIG. 47 illustrates a frequency characteristic of a return loss of the antenna devices illustrated in FIG. 44A and FIG. 46A and an antenna device according to a comparative example.

FIG. 47 illustrates a frequency characteristic of a return loss of the antenna devices illustrated in FIG. 44A and FIG. 46A and the antenna device according to the comparative example. In FIG. 47, a return loss characteristic RL1 is a return loss characteristic of the antenna device according to the comparative example, in which the coupling circuit 30 and the non-radiating resonant circuit 20 are not included, a return loss characteristic RL2 is a return loss characteristic of the antenna device illustrated in FIG. 44A, and a return loss characteristic RL3 is a return loss characteristic of the antenna device illustrated in FIG. 46A. The return loss characteristics RL1 and RL2 in FIG. 47 are the same as those illustrated in FIG. 6. Comparing the return loss characteristics RL2 and RL3 with each other, it is discovered that the return loss is small in all bands and that the high band is broadened to a wide band of, for example, from about 1.4 GHz to about 2.6 GHz, while using the same radiating element.

Figure 48:
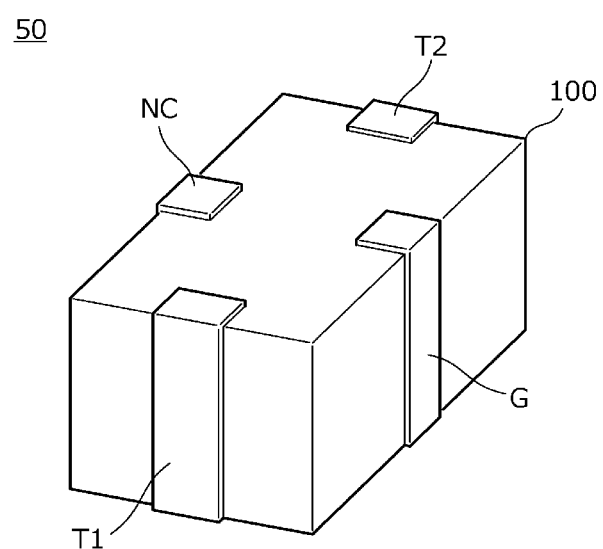
FIG. 48 is an external perspective view of the phase shifter 50.
Figure 49:
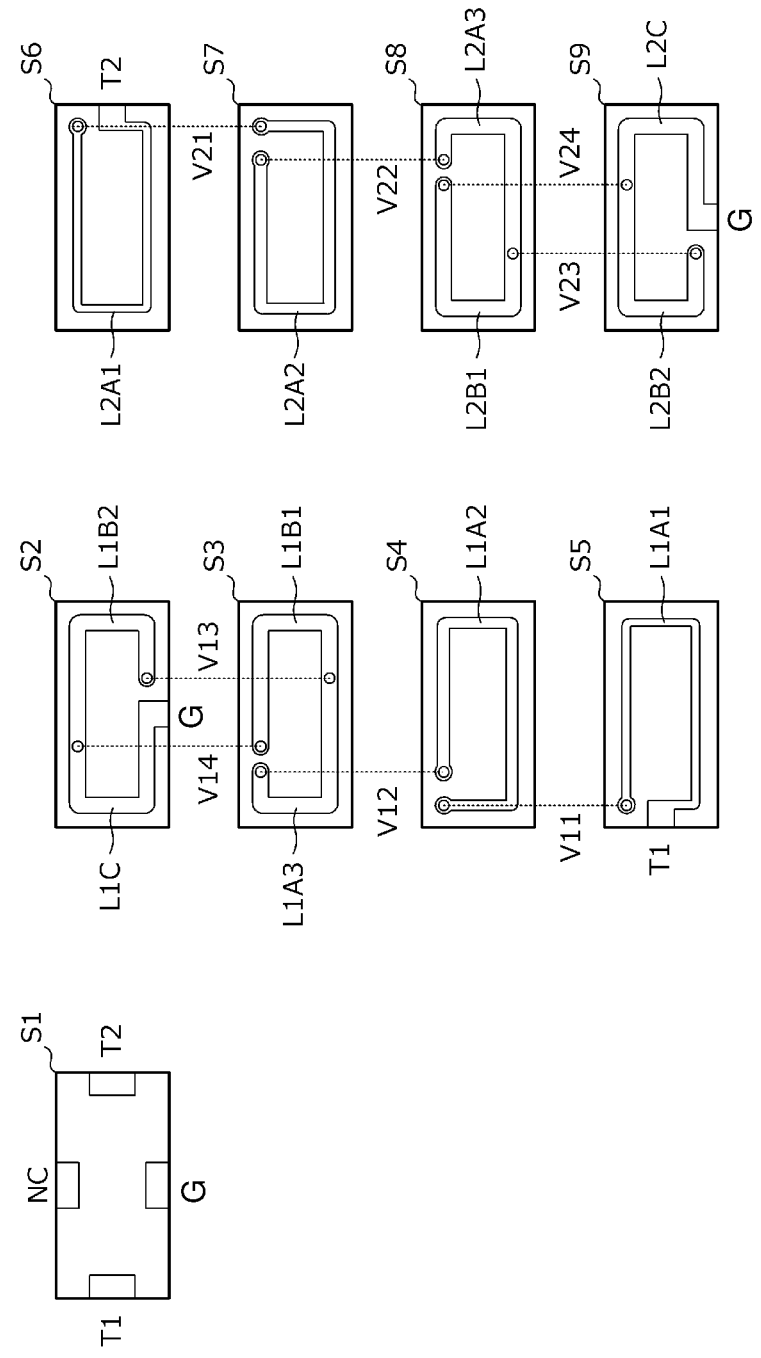
FIG. 49 is a plan view of layers in the phase shifter 50.
Figure 50:
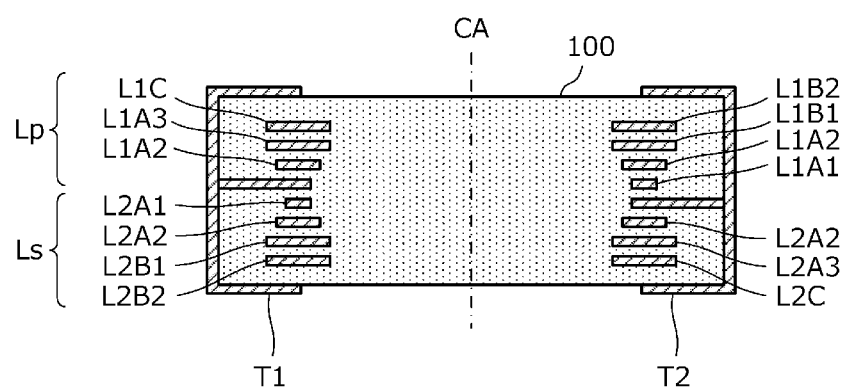
FIG. 50 is a sectional view of the phase shifter 50.

FIG. 48 is an external perspective view of the phase shifter 50, and FIG. 49 is a plan view of layers in the phase shifter 50. In addition, FIG. 50 is a sectional view of the phase shifter 50.

A top surface of a material S1 corresponds to a mount surface (bottom surface) of a multi-layer body 100. On the material S1, a terminal T1 as a first port P1, a terminal T2 as a second port P2, a ground terminal G, and an open terminal NC are provided.

The material layers of the multi-layer body 100 may preferably be, for example, a non-magnetic ceramic multi-layer body made of LTCC or other suitable material or a resin multi-layer body made of a resin material, such as polyimide or liquid crystal polymer. In this manner, since the material layers are non-magnetic (not a magnetic ferrite), it is possible to use the material layers as a transformer and a phase shifter with a predetermined inductance and a predetermined coupling coefficient even in a high frequency band exceeding several hundreds of MHz.

Each of the conductor patterns and the interlayer connection conductors is preferably made of, for example, a conductor material including Ag or Cu as a main component and having a small resistivity. In a case in which the material layers are ceramic, for example, the conductor patterns and the interlayer connection conductors are preferably formed by screen printing and firing of a conductive paste including Ag or Cu as a main component. In a case in which the material layers are resin, for example, the conductor patterns and the interlayer connection conductors are preferably patterned by etching or other suitable method of a metal foil such as an Al foil or a Cu foil.

The phase shifter 50 includes a plurality of insulating materials S1 to S9. Various conductor patterns are provided on the materials S1 to S9. The "various conductor patterns" include not only conductor patterns provided on surfaces of the materials but also interlayer connection conductors. The interlayer connection conductors include not only via conductors but also end surface electrodes provided on end surfaces of the multi-layer body.

The top surface of the material S1 corresponds to the mount surface (bottom surface) of the multi-layer body. On the material S1, the terminal T1 as the first port P1, the terminal T2 as the second port P2, the ground terminal G, and the open terminal NC are provided.

On the materials S5 and S4, conductors L1A1 and L1A2 are provided, respectively. On the material S3, conductors L1A3 and L1B1 are formed. On the material S2, conductors L1B2 and L1C are provided.

A first end of the conductor L1A1 is connected to the terminal T1 as the first port. A second end of the conductor L1A1 is connected to a first end of the conductor L1A2 via an interlayer connection conductor V11. A second end of the conductor L1A2 is connected to a first end of the conductor L1A3 via an interlayer connection conductor V12. A second end of the conductor L1A3 is connected to a first end of the conductor L1B1. The second end of the conductor L1A3 and the first end of the conductor L1B1 are connected to a first end of the conductor L1B2 via an interlayer connection conductor V13. A second end of the conductor L1B1 is connected to a second end of the conductor L1B2 via an interlayer connection conductor V14. The second end of the conductor L1B2 is connected to a first end of the conductor L1C. A second end of the conductor L1C is connected to the ground terminal G.

On the materials S6 and S7, conductors L2A1 and L2A2 are provided, respectively. On the material S8, conductors L2A3 and L2B1 are formed. On the material S9, conductors L2B2 and L2C are provided.

A first end of the conductor L2A1 is connected to the terminal T2 as the second port. A second end of the conductor L2A1 is connected to a first end of the conductor L2A2 via an interlayer connection conductor V21. A second end of the conductor L2A2 is connected to a first end of the conductor L2A3 via an interlayer connection conductor V22. A second end of the conductor L2A3 is connected to a first end of the conductor L2B1. The second end of the conductor L2A3 and the first end of the conductor L2B1 are connected to a first end of the conductor L2B2 via an interlayer connection conductor V23. A second end of the conductor L2B1 is connected to a second end of the conductor L2B2 via an interlayer connection conductor V24. The second end of the conductor L2B2 is connected to a first end of the conductor L2C. A second end of the conductor L2C is connected to the ground terminal G.

The conductors L1A1, L1A2, L1A3, L1B1, L1B2, and L1C and the interlayer connection conductors V11, V12, V13, and V14 define the first coil Lp. In addition, the conductors L2A1, L2A2, L2A3, L2B1, L2B2, and L2C and the interlayer connection conductors V21, V22, V23, and V24 define the second coil Ls. Both of the first coil Lp and the second coil Ls are preferably rectangular or substantially rectangular helical coils, for example.

Twenty-First Preferred Embodiment

A twenty-first preferred embodiment of the present invention will illustrate a radiating element having a structure that is different from that of the radiating element illustrated in the first preferred embodiment.

Figure 51:
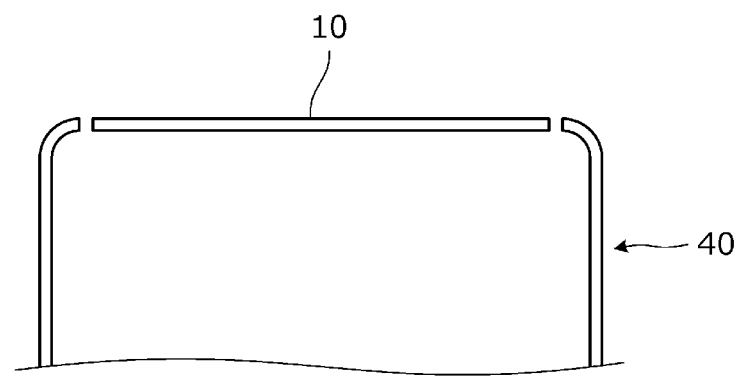
FIG. 51 is a plan view illustrating a portion of a metal housing of electronic equipment according to a twenty-first preferred embodiment of the present invention.

FIG. 51 is a plan view of a portion of a metal housing of electronic equipment. The metal housing of electronic equipment includes the radiating element 10, which is defined by an end portion of the metal hosing, and the metal housing main portion 40. Although the first preferred embodiment illustrated an example in which the end portion of the metal housing including three sides in a plan view is used as the radiating element 10, as illustrated in FIG. 51, the radiating element 10 may be defined by a planar end portion of the metal housing.

Figure 52A:
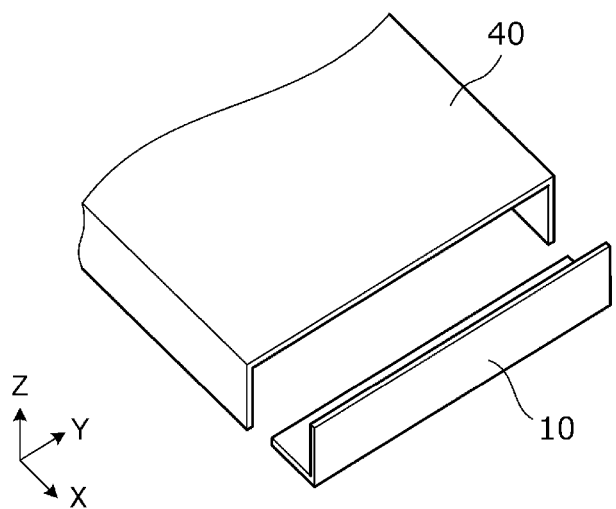
FIGS. 52A and 52B are perspective views illustrating portions of metal housings of different pieces of electronic equipment according to the twenty-first preferred embodiment of the present invention.
Figure 52B:
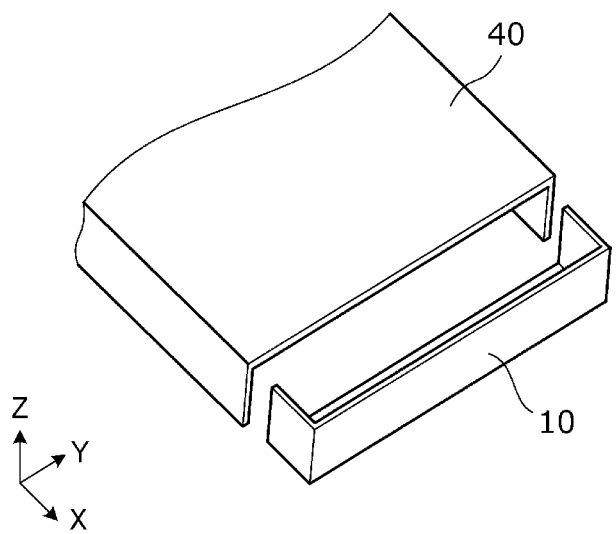

FIGS. 52A and 52B are perspective views of portions of metal housings of different pieces of electronic equipment.

In an example illustrated in FIG. 52A, the radiating element 10, which is defined by the end portion of the metal housing, includes a plane parallel or substantially parallel to the X-Y plane and a plane parallel or substantially parallel to the Y-Z plane. In an example illustrated in FIG. 52B, the radiating element 10, which is defined by the end portion of the metal housing, includes a plane parallel or substantially parallel to the X-Y plane, a plane parallel or substantially parallel to the Y-Z plane, and two planes parallel or substantially parallel to the X-Z plane.

As illustrated in FIGS. 52A and 52B, the end portion of the metal housing may have various shapes.

The above-described preferred embodiments have illustrated examples in which the end portion of the metal housing is used as the radiating element. However, a portion of the radiating element or the entire radiating element may be a conductor pattern provided on a circuit substrate, for example, or may be a member different from the housing.

Although the example illustrated in FIG. 4 illustrates a case in which a parasitic capacitance is generated between an end of the radiating element 10 and the ground, a capacitance having a low impedance in a high band may be actively provided at this position so as to cause the radiating element 10 to define and function as a PIFA. In addition, the position at which the capacitance is generated may be connected to the ground to define and function as a PIFA.

The linear conductor pattern of the non-radiating resonant circuit 20 is not limited to a shape that returns and may extend in one direction. Alternatively, the non-radiating resonant circuit 20 may be bent in an L-shape or may be curved, for example. Furthermore, the non-radiating resonant circuit 20 may include a conductor pattern that splits into a plurality of branches. Thus, a plurality of poles are able to be generated.

In addition, the non-radiating resonant circuit 20 may include a tip of the linear conductor pattern connected to the ground so as to define and function as a circuit similar to a short stub.

In the above-described examples, examples of using fundamental wave resonance of the non-radiating resonant circuit 20 have mainly described. However, any harmonic resonance of the non-radiating resonant circuit 20, such as double-wave resonance (secondary resonance), triple-wave resonance (tertiary resonance), or ³⁄₂-wave resonance, for example, may also be used. In addition, both of the fundamental wave resonance and the harmonic resonance may be used, or a plurality of harmonic resonances may be used.

As for the radiating element 10, similarly, any harmonic resonance, such as double-wave resonance (secondary resonance), triple-wave resonance (tertiary resonance), or ³⁄₂-wave resonance, for example, may also be used. In addition, both of the fundamental wave resonance and the harmonic resonance may be used, or a plurality of harmonic resonances may be used.

The above-described preferred embodiments have illustrated a smartphone or electronic equipment having the same shape as the smartphone. However, the preferred embodiments may be similarly applied to various types of electronic equipment, such as a mobile phone including a feature phone, a wearable terminal including a smart watch and smart glasses, a lap top PC, a tablet terminal, a camera, a game console, a toy, or other suitable devices, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
   a radiating element;
   a coupling circuit including a first coupling element and a second coupling element, the first coupling element being connected between the radiating element and a feeder circuit, the second coupling element being coupled to the first coupling element; and
   a non-radiating resonant circuit connected to the second coupling element; wherein
   the non-radiating resonant circuit is fed by the feeder circuit through the coupling circuit; and
   a frequency characteristic of a return loss of the radiating element is adjusted by a resonant frequency characteristic of the non-radiating resonant circuit.

2. The antenna device according to claim 1, further comprising:
   a ground; wherein
   a direction of a magnetic field generated when current flows in the first coupling element in a direction from a terminal connected to the feeder circuit to a terminal connected to the radiating element is opposite to a direction of a magnetic field generated when current flows in the second coupling element in a direction from a terminal connected to the non-radiating resonant circuit to a terminal connected to the ground.

3. The antenna device according to claim 1, wherein the first coupling element and the second coupling element are multi-layered coil conductor patterns, and the coupling circuit defines a transformer in which the first coupling element and the second coupling element are electromagnetically coupled to each other.

4. The antenna device according to claim 1, wherein at least half of the non-radiating resonant circuit is included within a formation region of the radiating element in a plan view of the radiating element.

5. The antenna device according to claim 1, wherein the radiating element is defined by a conductive member that includes three sides in a plan view, and the non-radiating resonant circuit is surrounded by the three sides in a plan view.

6. The antenna device according to claim 1, wherein the non-radiating resonant circuit is defined by a linear conductor pattern that includes a returning portion along the linear conductor.

7. The antenna device according to claim 6, wherein the conductor pattern includes a first linear conductor pattern portion that extends from the coupling circuit and a second conductor pattern portion that returns, at the returning portion, to be spaced away from the radiating element.

8. The antenna device according to claim 1, further comprising a phase shifter that is connected between the feeder circuit and the first coupling element and that has a frequency dependency.

9. The antenna device according to claim 1, further comprising:
   a ground; wherein
   a second terminal of the second coupling element is connected to the ground, the second terminal being opposite to a first terminal to which the non-radiating resonant circuit is connected; and
   a length of a line between the first coupling element and the feeder circuit and a length of a line between the second terminal of the second coupling element and the ground are each less than about ⅛ wavelength of a resonant frequency.

10. The antenna device according to claim 9, further comprising an inductor that is connected between the first terminal of the second coupling element and the ground.

11. The antenna device according to claim 9, further comprising a capacitor that is connected between the first terminal of the second coupling element and the ground.

12. The antenna device according to claim 1, further comprising an inductor that is connected between the second coupling element and the non-radiating resonant circuit.

13. The antenna device according to claim 1, further comprising a capacitor that is connected between the second coupling element and the non-radiating resonant circuit.

14. The antenna device according to claim 1, further comprising:
   a second coupling circuit including a third coupling element and a fourth coupling element, the third coupling element being connected between the first coupling element and the feeder circuit, the fourth coupling element being coupled to the third coupling element; and
   a second non-radiating resonant circuit connected to the fourth coupling element.

15. The antenna device according to claim 1, further comprising:
   a second coupling circuit including a third coupling element and a fourth coupling element, the third coupling element being connected between the second coupling element and the non-radiating resonant circuit, the fourth coupling element being coupled to the third coupling element; and
   a second non-radiating resonant circuit connected to the fourth coupling element.

16. The antenna device according to claim 1, further comprising:
   a ground; and
   a switch connected between the non-radiating resonant circuit and the ground.

17. The antenna device according to claim 1, wherein
the coupling circuit includes a parasitic capacitance; and
the antenna device further includes an inductor that is connected to the coupling circuit and that reduces or prevents a reactance component generated in the coupling circuit by parallel resonance with the parasitic capacitance.

18. Electronic equipment comprising:
the antenna device according to claim 1; and
a housing in which the feeder circuit is accommodated; wherein
a portion of the radiating element or an entirety of the radiating element is defined by a portion of the housing.

19. The electronic equipment according to claim 18, further comprising:
   a ground; wherein
   a direction of a magnetic field generated when current flows in the first coupling element in a direction from a terminal connected to the feeder circuit to a terminal connected to the radiating element is opposite to a direction of a magnetic field generated when current flows in the second coupling element in a direction from a terminal connected to the non-radiating resonant circuit to a terminal connected to the ground.

20. An antenna device comprising:
   a radiating element to which a feeder circuit is connected;
   a coupling circuit including a first coupling element and a second coupling element, the first coupling element being connected between the radiating element and a ground, the second coupling element being coupled to the first coupling element; and
   a non-radiating resonant circuit connected to the second coupling element; wherein
   the non-radiating resonant circuit is fed by the feeder circuit through the coupling circuit; and
   a frequency characteristic of a return loss of the radiating element is adjusted by a resonant frequency characteristic of the non-radiating resonant circuit.

* * * * *